(12) United States Patent
Chen et al.

(10) Patent No.: US 7,508,110 B2
(45) Date of Patent: Mar. 24, 2009

(54) SURFACE PLASMON COUPLED NONEQUILIBRIUM THERMOELECTRIC DEVICES

(75) Inventors: Gang Chen, Carlisle, MA (US);
Ronggui Yang, Cambridge, MA (US);
Arvind Narayanaswamy, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 831 days.

(21) Appl. No.: 11/007,557

(22) Filed: Dec. 8, 2004

(65) Prior Publication Data

US 2005/0247337 A1    Nov. 10, 2005

Related U.S. Application Data

(60) Provisional application No. 60/567,987, filed on May 4, 2004.

(51) Int. Cl.
*H02N 10/00* (2006.01)
*G21H 1/00* (2006.01)
*H01L 37/00* (2006.01)

(52) U.S. Cl. .................... 310/306; 310/303; 136/206
(58) Field of Classification Search ............... 310/306
See application file for complete search history.

(56) References Cited

U.S. PATENT DOCUMENTS

| | | | |
|---|---|---|---|
| 3,169,200 A | | 2/1965 | Huffman |
| 4,280,074 A | * | 7/1981 | Bell .................... 310/306 |
| 4,423,347 A | | 12/1983 | Kleinschmidt et al. |
| 4,937,489 A | | 6/1990 | Hattori et al. |
| 5,049,775 A | | 9/1991 | Smits |
| 5,083,056 A | | 1/1992 | Kondou et al. |

(Continued)

FOREIGN PATENT DOCUMENTS

DE      3818192 A1    12/1989

(Continued)

OTHER PUBLICATIONS

Pines, Elementary excitations in solids: lectures on protons, electrons and plasmons, 1999, Perseus Books, 8.*

(Continued)

*Primary Examiner*—Alexa D Neckel
*Assistant Examiner*—Miriam Berdichevsky
(74) *Attorney, Agent, or Firm*—Hamilton, Brook, Smith & Reynolds, P.C.

(57) ABSTRACT

A surface-plasmon-coupled thermoelectric apparatus includes a first surface-plasmon substrate and a thermoelectric substrate electrically coupled to a plurality of electrodes. The substrates are electrically isolated from each other, and a first face of the thermoelectric substrate opposes a first face of the first surface-plasmon substrate to define a phonon insulating gap. A method of transferring thermal energy across the phonon insulating gap includes creating a first surface-plasmon polariton at the first surface-plasmon substrate when the first surface-plasmon substrate is coupled to a first thermal reservoir. Also included is creating a nonequilibrium state between the electron temperature and the phonon temperature at a first face of the thermoelectric substrate, when a second face of the thermoelectric substrate is coupled to a second thermal reservoir. Also included is coupling the first surface plasmon polariton with electrons in the thermoelectric substrate across the phonon insulating gap, thereby transferring thermal energy between the thermal reservoirs through the phonon insulating gap.

25 Claims, 22 Drawing Sheets

U.S. PATENT DOCUMENTS

| | | | |
|---|---|---|---|
| 5,351,412 | A | 10/1994 | Furuhata et al. |
| 5,465,021 | A | 11/1995 | Visscher et al. |
| 5,701,043 | A | 12/1997 | Razzaghi |
| 5,792,667 | A | 8/1998 | Florin et al. |
| 6,720,704 | B1 | 4/2004 | Tavkhelidze et al. |
| 6,740,600 | B2 | 5/2004 | Ghoshal et al. |
| 2003/0184188 | A1 | 10/2003 | Kucherov et al. |
| 2004/0050415 | A1 | 3/2004 | Kucherov et al. |

FOREIGN PATENT DOCUMENTS

| | | | | |
|---|---|---|---|---|
| WO | WO 9913562 A1 | * | 3/1999 | ................. 310/306 |

OTHER PUBLICATIONS

Jackson, Handbook of semiconductor technology, 2000, 2, 70-73.*
Harman, T.C., et al., "Quantum Dot Superlattice Thermoelectric Materials and Devices,"*Science*, 297: 2229-2232 (2002).
Venkatasubramanian, R., et al., "Thin-Film Thermoelectric Devices With High Room-Temperature Figures Of Merit," *Nature*, 413: 597-602 (2001).
Hsu, K.F., et al., "Cubic AgPb$_m$SbTe$_{2+m}$: Bulk thermoelectric Materials With High Figure Of Merit," *Science*, 303: 818-821 (2004).
Shakouri, A., et al., "Heterostructure Integrated Thermionic Coolers," *Appl. Phys. Lett.*, 71(9): 1234-1236 (1997).
Mahan, G.D., et al., "Multilayer Thermionic Refrigeration," *Phys. Rev. Lett.*, 80(18): 4016-4019 (1998).
Vining, C.B., et al.,"The B Factor In Multilayer Thermionic Refregeration," *J. Appl. Phys.*, 86(12): 6852-6853 (1998).
Pipe, K.P., et al., "Bias-Dependent Peltier Coefficient And Internal Cooling In Bipolar Devices," *Phys. Rev. B*, 66(12): 125316-1-125316-11 (2002).
O'Brien, B.J., et al., "Cascading Of Peltier Couples For Thermoelectric Cooling," *J. Appl. Phys.*, 27(7): 820-823 (1956).
Snyder, G.J., et al., "Supercooling Of Peltier Cooler Using A Current Pulse," *J. Appl. Phys.*, 92(3): 1564-1569 (2002).
Hatsopoulos, G.N., et al., "Measured Thermal Efficiencies Of A Diode Configuration Of A Thermo Electron Engine," *J. Appl. Phys.*, 26(8): 1124-1125 (1958).
Hishinuma, Y., et al., "Measurements of Cooling by Room-Temperature Thermionic Emission Across a Nanometer Gap," *J. Appl. Phys.*, 94(7): 4690-4696 (2003).
Hishinuma, Y, et al., "Refrigeration by Combined Tunnelling and Thermionic Emission in Vacuum: Use of Nanometer Scale Design," *Appl. Phys. Lett*, 78: 2572-2574 (2001).
Coutts, T.J., "A Review Of Progress In Thermophotovoltaic Generation Of Electricity," *Renewable Sustainable Energy Rev.*, 3: 77-184 (1999).
Zakordonets, V.S., et al., "Thermoelectric Figure of Merit of Monopolar Semiconnductors with Finite Dimensions," *Semiconductors*, 31(3): 265-267 (1997).
Narayanaswamy, A., et al., "Surface Modes For Near Filed Thermophotovoltaics,"*Appl. Phys. Lett.*, 82(20): 3544-3546 (2003).
Polder, D., et al., "Theory Of Radiative Heat Transfer Between Closely Spaced Bodies," *Phys. Rev. B*, 4(10): 3303-3314 (1971).
DiMatteo, R.S., et al., "Enhanced Photogeneration Of Carriers In A Semiconductor Via Coupling Across A Nonisothermal Nanoscale Vacuum Gap," *Appl. Phys. Lett.*, 79(12): 1894-1896 (2001).
Carminati, R., et al., "Near-Filed Effects in Spatial Coherence of Thermal Sources," *Phys. Rev. Lett.*, 82(8): 1660-1663 (1999).
Schoenlein, W., et al., "Femtosecond Studies of Nonequilibrium Electronic Processes In Metals,"*Phys. Rev. Lett.*, 58(16): 1680-1683 (1987).
Wood, C., "Materials For Thermoelectric Energy Conversion," *Rep. Prog. Phys.*, 51: 459-539 (1988).
Ridley, B.K., "Hot Electrons In Low-Dimensional structures," *Rep. Prog. Phys.*, 54: 169-256 (1991).
Bower, R., et al., "InAs And InSb As Thermoelectric Materials," *J. Appl. Phys.*, 30(6): 930-934 (1959).
Sofo, J.O., et al., "Transport Coefficients And Thermoelectric Figure of Merit Of n-Hg$_{1-x}$Cd$_x$Te," *J. Appl. Phys.*, 76(4): 2249-2254 (1994).

Fujimoto, J., et al., "Femtosecond Laser Interaction with Metallic Tungsten and Nonequilibrium Electron and Lattice Temperatures," *Phys. Rev. Lett.*, 53(19): 1837-1840 (1984).
Elsayed-Ali, H.E., et al., "Time-Resolved Observation Of Electron-Phonon Relaxation In Cooper,"*Phys. Rev. Lett.*, 58(12): 1212 (1987).
Allen, P.B., "Theory Of Relaxation Of Electrons In Metals," *Phys. Rev. Lett.*, 59(13): 1460-1463 (1987).
Groeneveld, R.H.M., et al., "Femtosecond Spectroscopy Of Electron-Electron And Electron-Photon Energy Relaxation In Ag And Au,"*Phys. Rev. B*, 51(17): 11433-11445 (1995).
Paskov, P. P., "Refractive Indices Of InSb, InAs, GaSb, InAs$_x$ Sb$_{1-x}$ Ga$_x$ Sb: Effects Of Free Carriers," *J. Appl. Phys.* 81(4): 1890-1898 (1997).
Whale, M.D., *A Fluctuational Electrodynamic Analysis of Microscale Radiative Heat Transfer and the Design of Microscale Thermophotovoltaic Devices*, Ph.D. Thesis, (MIT, Cambridge, 1997). (Front Page and Table of Contents).
Alfano, R.R., Ed., *Semiconductor Probed by Ultrafast Laser Spectroscopy* (NY: Academic Press) (1984). (Front Page and Table of Contents).
Harman, T.C., et al., *Thermoelectric and Thermomagnetic Effects and Applications* (NY: McGraw-Hill) (1967). (Front Page and Table of Contents).
Goldsmid, H.J., *Electronic Refrigeration* (London: Pion Ltd.) (1986). (Front Page and Table of Contents).
Rowe, D.M., *CRC Handbook of Thermoelectrics* (CRC Press, Inc.) (1995). (Front Page and Table of Contents).
Nolas, G.S., et al., *Thermoelectrics: Basics Principles and New Materials Developments* (Berlin: Springer-Verlag) (2001). (Front Page and Table of Contents).
Tsang, L., et al., *Scattering of Electromagnetic Waves* (Wiley, 2000). (Front Page and Table of Contents).
Rytov, S.M., et al., *Principles of Statistical Radiophysics*, vol. 3 (Berlin: Springer) (1987). (Front Page and Table of Contents).
Conwell, E.M., *High Field Transport in Semiconductors* (NY and London: Academic Press) (1967). (Front Page and Table of Contents).
Ziman, J.M., *Electrons and Phonons* (Oxford: Clarendon) (1960). (Front Page and Table of Contents).
Ghoshal, U., et al., "Enhanced Thermoelectric Cooling At Cold Junction Interfaces," *Appl. Phys. Lett.*, 82(16): 3006-3008 (2002).
Gang, C., et al., "Nonequilibrium Phonon And Electron Transport In Heterostructures And Superlattices," *Microscale Thermophys. Eng.*, 5: 71-88 (2001).
Seeger, K., *Semiconductor Physics*, 8th, (NY: Springer) (2002). (Front Page and Table of Contents).
Cowling, P.W., et al., "Optimization Of A Thermoelectric Heat Pump Through Cascading," *Pergamon Press, Ltd.*, 7: 289-295 (1968).
Tritt, T.M., Ed., "Recent Trends in Thermoelectric Materials Research I," *Semiconductors and Semimetals*, 69-71 (2001).
Cowling, P.W., et al., *Energy Conversion*, 7: 289 (1968).
Gurevich, Y.G., et al., "Thermo-emf and Thermoelectric Current in Unipolar Semiconductors With Finite Dimensions," *Sov. Phys. Semicond.*, 26(11): 1091-1094 (1992).
Gurevich, Y.G., et al., "The Electron-Phonon Drag and Transport Phenomena in Semiconductors," *Phys. Rep. (Rev. Sec. Phys. Lett.)*, 181(6): 327-394 (1989).
Bulat, L.P., et al., "Thermal Effects At Boundaries of Solids," *Sov. Phys. Semicond.*, 18(4): 383-384 (1984).
Anatychuk, L.I., et al., "Influence of Size Effects on The Properties of Cooling Themoelements," *Sov. Phys. Semicond.*, 21(2): 206-207 (1987).
Bulat, L.P., "Thermoelectricity Under Large Temperature Gradients," *J. Thermoelect.*, 4: 3-34 (1997).
Chen, G., et al., "Nonequilibrium Phonon And Electron Transport In Heterostructures And Superlattices," *Microscale Thermophys. Eng.*, 5: 71-88 (2001).
Cravalho, E.G., et al., "Effect of Small Spacings on Radiative Transfer Between Two Dielectrics," *ASME J. Heat Transf.*, 89: 351-358 (1967).
Qiu, T.Q., et al., "Heat Transfer Mechanisms During Short-Pulse Laser Heating of Metals," *Trans. ASME, J. Heat Transf.*, 115: 835-841 (1993).

Kaganov, M.I., et al., "Relaxation Between Electrons and The Crystalline Lattice," *Sov. Phys. JETP*, 4(2): 173-178 (1957).

Ridley, B.K., *Quantum Processes in Semiconductors* (Oxford: Oxford Univ. Press) (1999).

Ferry, D.K., *Semiconductor Transport* (NY: Taylor & Francis) (2000).

Ioff, A.F., *Semiconductor Thermoelements and Thermoelectric Cooling* (London: Info-search) (1956).

Tauc, J., *Photo and Thermoelectric Effects in Semiconductors* (NY: Pergamon Press) (1962).

Challis, L., Ed., *Electron-Phonon Interactions in Low Dimensional Structure* (Oxford: Oxford University Press) (2003).

Chen, G. et al., "Engineering nanoscale phonon and photon transport for direct energy conversion", Superlattices and Microstrutures, Academic Press, London, GB, vol. 35, No. 3-6, Mar. 2004, pp. 161-172.

Ronggui, Yang et al., "Surface-plasmon coupled nonequilibrium thermoelectric refrigerators and power generators", Journal of Computational and Theoretical Nanoscience, 'Online! vol. 2, No. 1, Mar. 2005, pp. 1-13, XP002364651, American Scientific Publishers Retrieved from the Internet: URL:http://web.mit.edu/ronggui/www/PDF/J1.pdf>.

Ronggui, Yang et al., "Recent developments in nanostructured thermoelectric materials and devices", Thermal and Thermomechanical Phenomena in Electronic Systems, 2004. ITHERM '04. The Ninth Intersociety Conference on Las Vegas, NV, USA Jun. 1-4, 2004, Piscataway, NH, USA, IEEE, vol. 2, Jun. 1, 2004, pp. 731-732.

Sungtaek, Ju Y. et al., "Study of interface effects in thermoelectric microrefrigerators", Journal of Applied Physics, American Institute of Physics, New York, U.S., vol. 88, No. 7, Oct. 1, 2000, pp. 4135-4139.

* cited by examiner

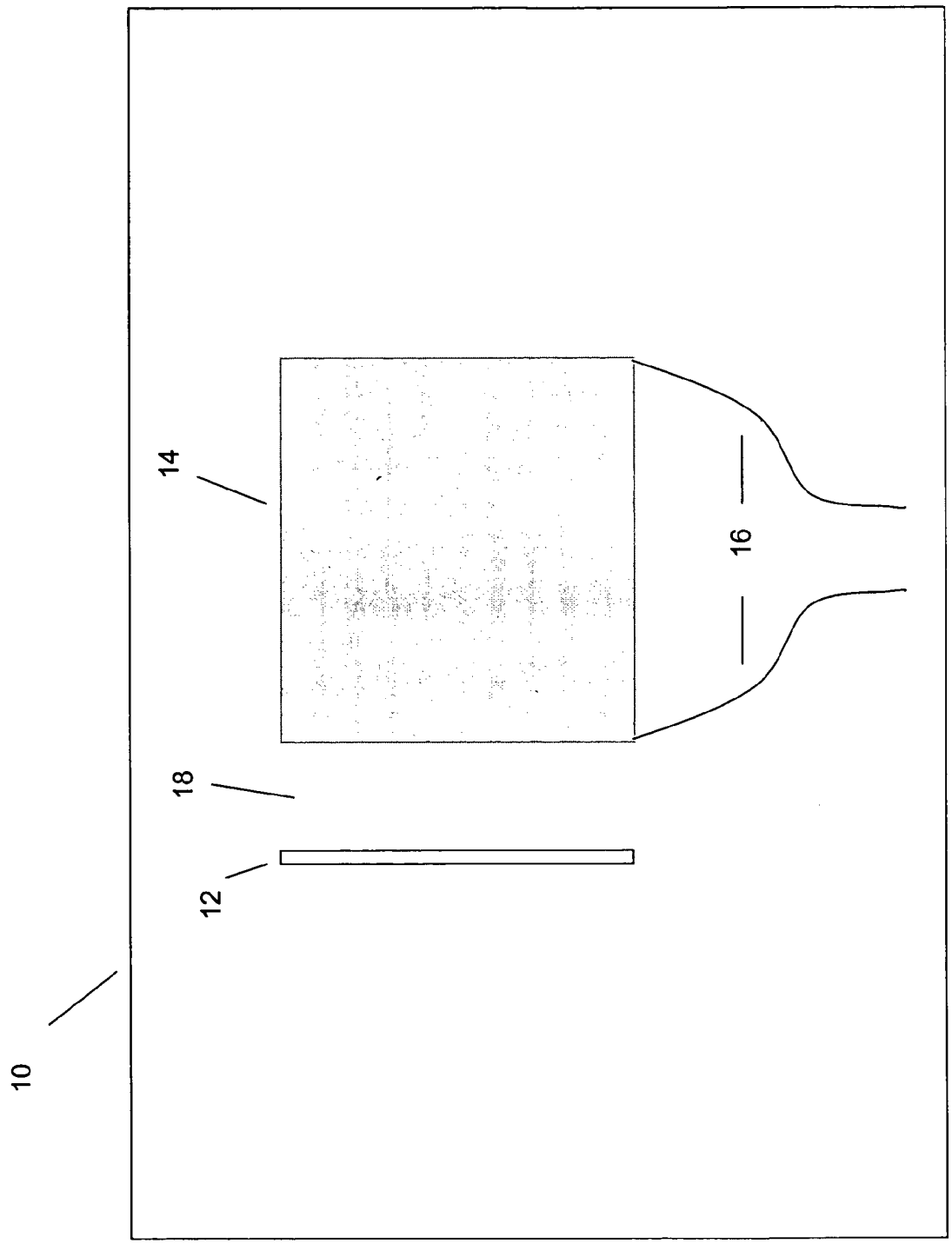

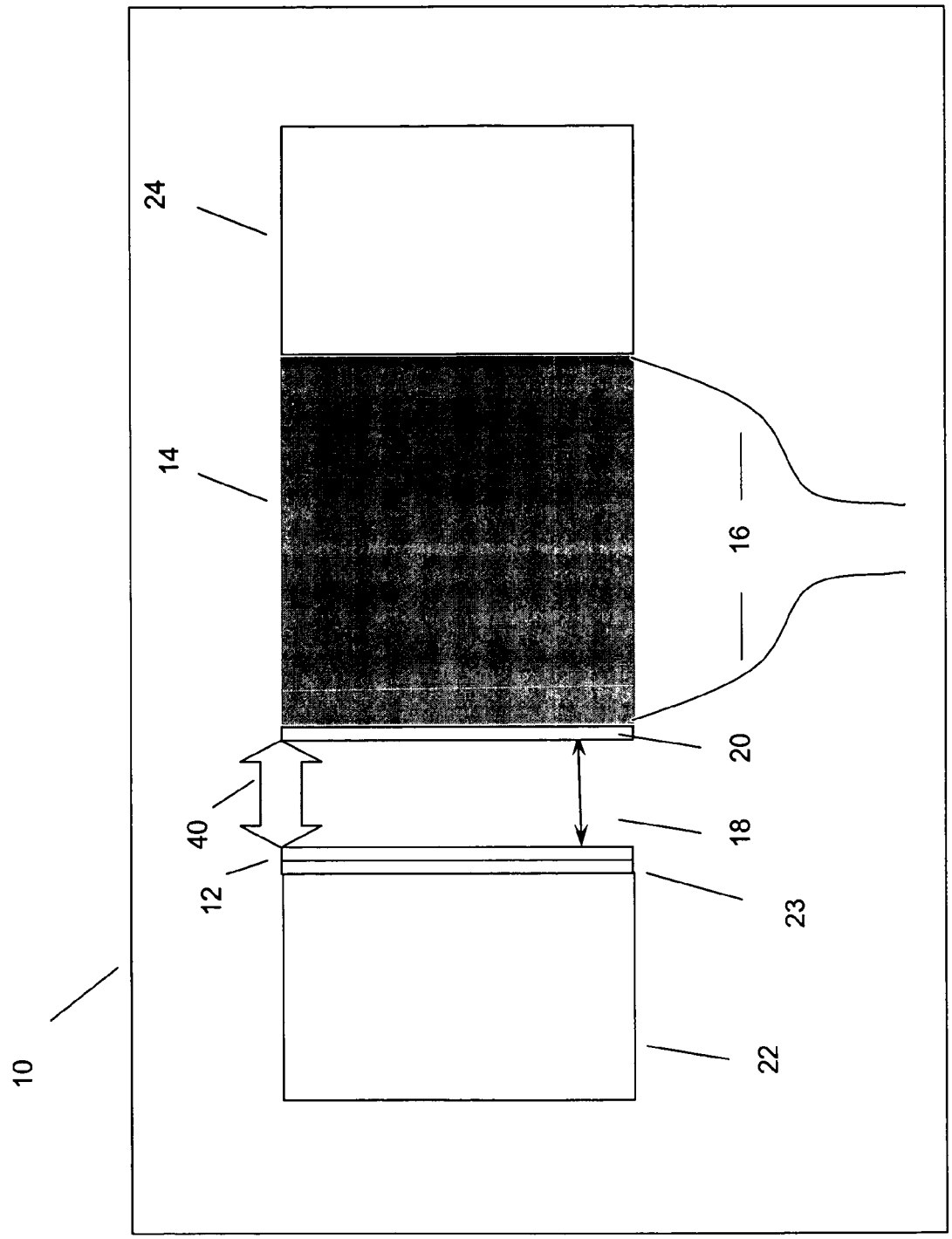

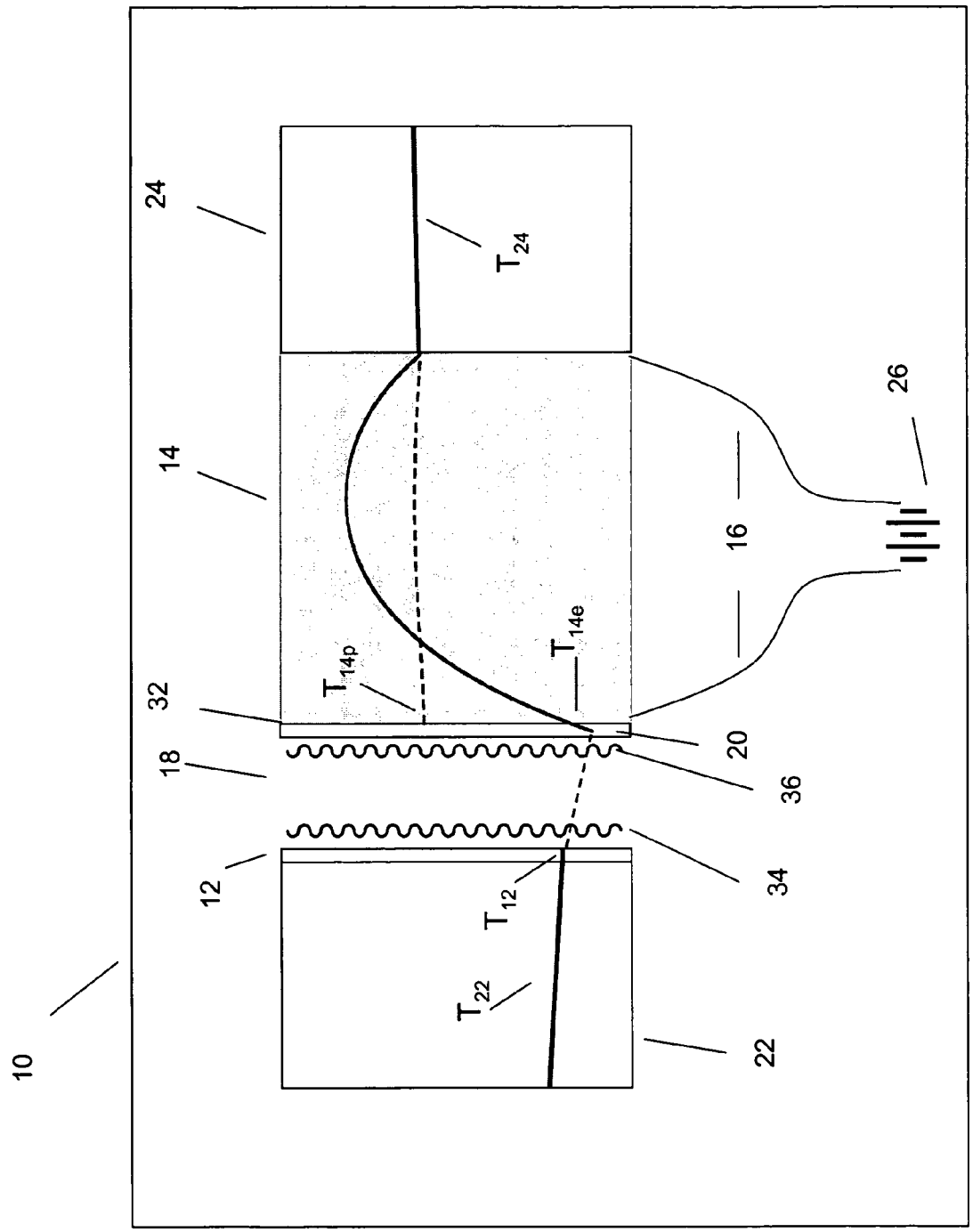

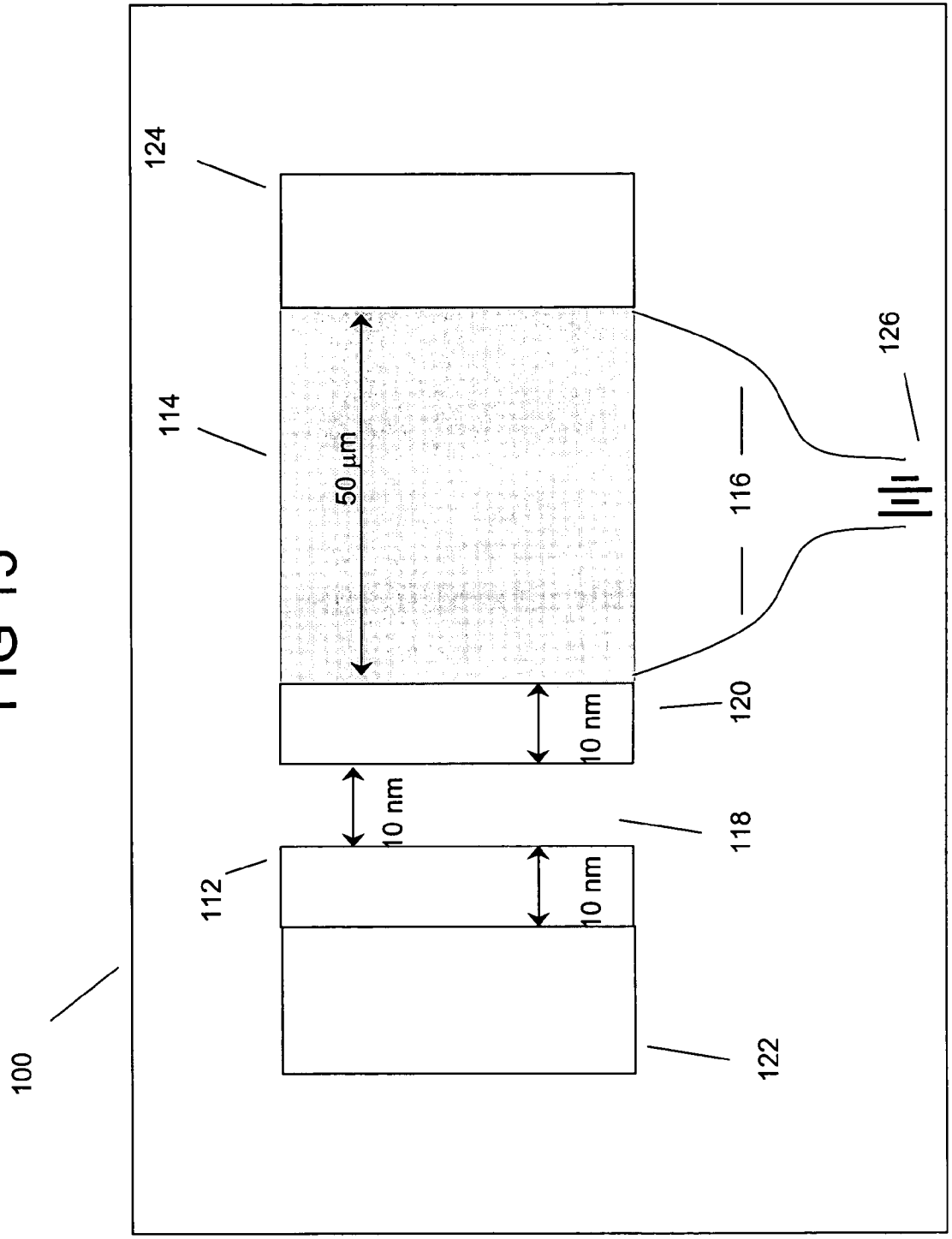

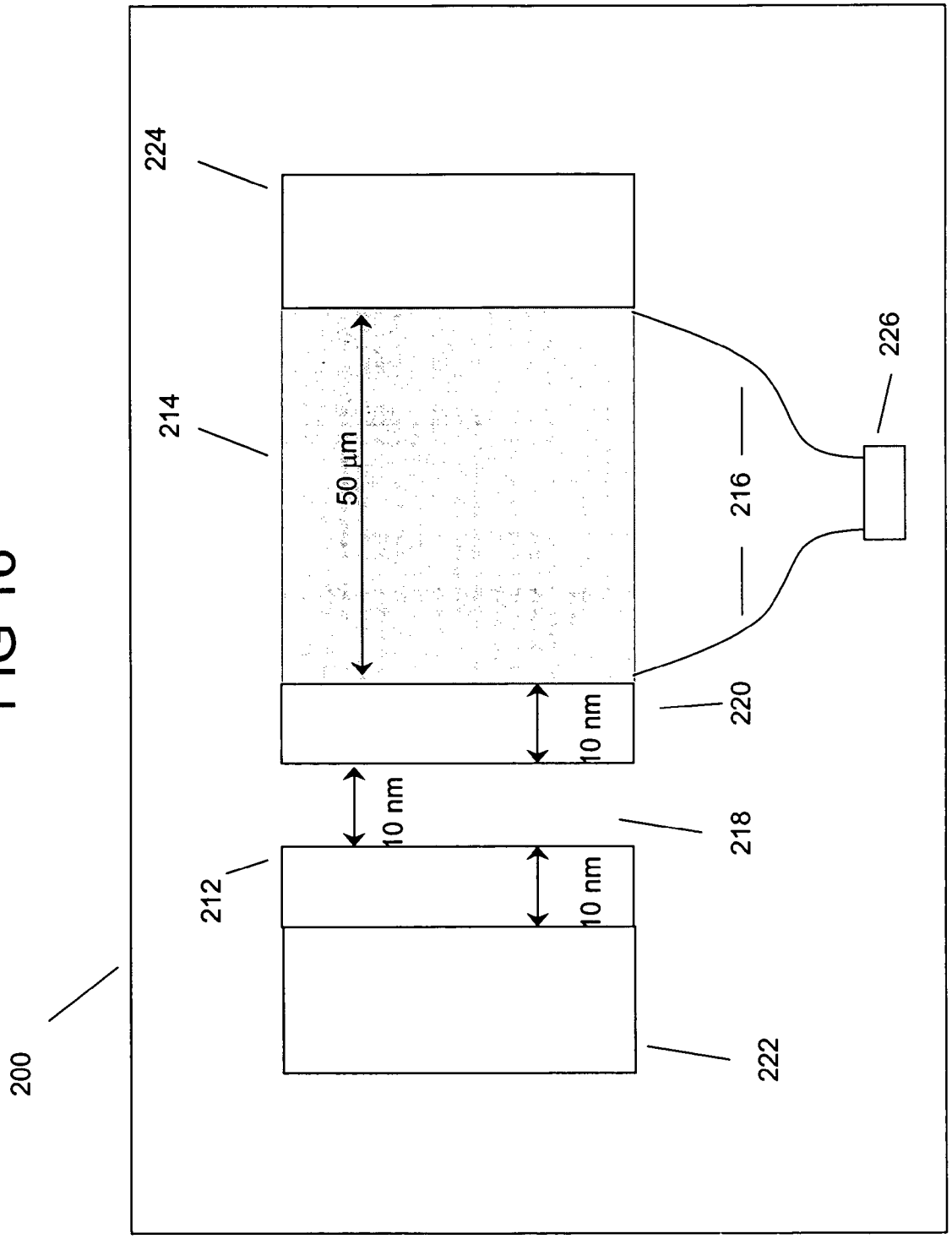

US 7,508,110 B2

SURFACE PLASMON COUPLED NONEQUILIBRIUM THERMOELECTRIC DEVICES

RELATED APPLICATION

This application claims the benefit of U.S. Provisional Application No. 60/567,987, filed on May 4, 2004 the entire teachings of which are incorporated herein by reference.

GOVERNMENT SUPPORT

The invention was supported, in whole or in part, by a grant from the Office of Naval Research/Department of Defense/Multidisciplinary University Research Initiative (ONR/DOD/MURI) on Electromagnetic Metamaterials Through UCLA, Grant No. N00014-01-1-0803. The Government has certain rights in the invention.

BACKGROUND OF THE INVENTION

Thermoelectric energy conversion devices employ electrons for energy transfer. Such devices can operate in a refrigeration mode, e.g., by applying a current to transfer heat away from a cooling target, or can operate in a power generation mode, e.g. by using a load circuit to generate power from the temperature difference between two thermal reservoirs. However, phonon heat conduction (i.e., heat conduction due to vibration motion of the atoms in the thermoelectric material) typically reduces the efficiency of such devices, because it tends to transfer additional heat detrimentally from the heat source to the cold reservoir in power generation mode or transfer heat from the hot reservoir to the cooling object in refrigeration mode.

Attempts have been made to decouple electron and phonon thermal energy transport by incorporating a gap in the device that prevents phonon transfer, for example in vacuum thermionic devices and electron tunneling refrigerators. Electron thermionic emission, however, is limited by the work function of available materials. The electron tunneling refrigerators relies on a thin enough (on the scale of angstroms) vacuum gap to allow thermal energy transfer through quantum mechanical tunneling of electrons across the gap. The total energy transport in these devices is limited by the amount of current that can be transferred via quantum tunneling. Further, it is difficult to manufacture and maintain the precision gap required for the tunneling effect to operate.

Others have tried to minimize phonon transfer in electron tunneling devices by separating two materials by angstrom scale features which contact the separated materials but have minimal surface contact. Such devices thus still have some phonon energy transfer and are still limited as above by the amount of current that can be transferred via quantum tunneling.

Therefore, there is a need for efficient thermoelectric devices which have increased efficiency, and which can overcome the problems discussed above.

SUMMARY OF THE INVENTION

Efficient thermoelectric devices and methods of employing them are disclosed herein that employ coupled surface-plasmon polaritons to transfer thermal energy across a phonon insulating gap.

A surface-plasmon-coupled thermoelectric apparatus includes a first surface-plasmon substrate and a thermoelectric substrate electrically coupled to a plurality of electrodes. The substrates are electrically isolated from each other, and a first face of the thermoelectric substrate opposes a first face of the first surface-plasmon substrate to define a phonon insulating gap.

A method of transferring thermal energy across the phonon insulating gap includes creating a first surface-plasmon polariton at the first surface-plasmon substrate when the first surface-plasmon substrate is coupled to a first thermal reservoir. Also included is creating a nonequilibrium state between the electron temperature and the phonon temperature at a first face of the thermoelectric substrate, when a second face of the thermoelectric substrate is coupled to a second thermal reservoir. Also included is coupling the first surface plasmon polariton with electrons in the thermoelectric substrate across the phonon insulating gap, thereby transferring thermal energy between the thermal reservoirs through the phonon insulating gap.

The thickness of the phonon insulating gap is generally from about 1 nanometer to about 100 nanometers, and is typically less than about 10% of the wavelength of the surface-plasmon polaritons. In some embodiments, a second surface-plasmon substrate is coupled to the thermoelectric substrate, and the surface-plasmon substrates are separated by the phonon insulating gap. Generally, each substrate is a semiconductor. Some embodiments include a refrigeration mode. Other embodiments include a power generation mode.

Such devices and methods are more efficient than those relying on quantum mechanical tunneling of electrons across angstrom scale gaps. Typically, the amount of thermal energy that can be transferred via surface-plasmon polariton coupling is greater than the tunneling of evanescent waves from total internal reflection and can create the nonequilibrium states in the thermoelectric elements. Further, because typical surface-plasmon polariton wavelengths are relatively large, the gap employed as a phonon insulating gap can be relatively large, on the scale of about 1 to about 100 nanometers, which is easier to manufacture and maintain than the angstrom-scale gap needed in devices relying on quantum mechanical tunneling of electrons.

BRIEF DESCRIPTION OF THE DRAWINGS

FIG. 1A depicts an embodiment of surface-plasmon-coupled thermoelectric apparatus 10 of the invention.

FIG. 1B depicts apparatus 10 of the invention with additional optional components.

FIG. 1C depicts apparatus 10 of the invention equipped to operate in a refrigeration mode, wherein optional power supply 26 can be connected to electrodes 16.

FIG. 1E, comparison refrigeration device 50, and FIG. 1F, comparison power generation device 52.

FIG. 1G, refrigerator, and FIG. 1H, power generator.

FIG. 6A depicts calculated electron $(T_e-T_m)$ and phonon $(T_p-T_m)$ temperature drops inside the surface-plasmon supporting material layer, and FIG. 6B depicts the calculated temperature drop at the plasmon material surface as a function of the thickness.

for various $k_e/k$.

Figure 9:
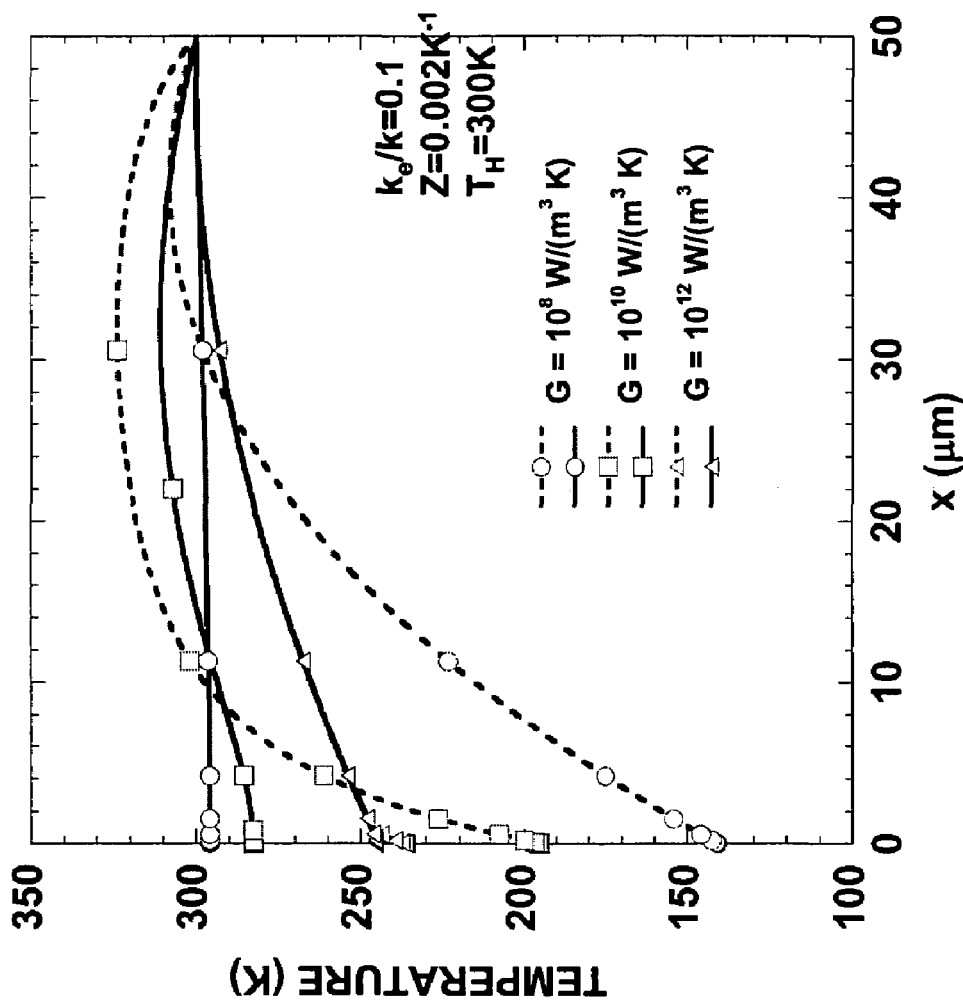

FIG. 9 graphs the temperature distribution calculated inside a 50 μm surface-plasmon coupled nonequilibrium thermoelectric refrigerator when the minimum cold end temperature is reached (dashed lines—electron temperature, solid lines—phonon temperature). The smaller the electron phonon coupling constant G, the larger the temperature difference calculated between electrons and phonons.

Figure 10A:
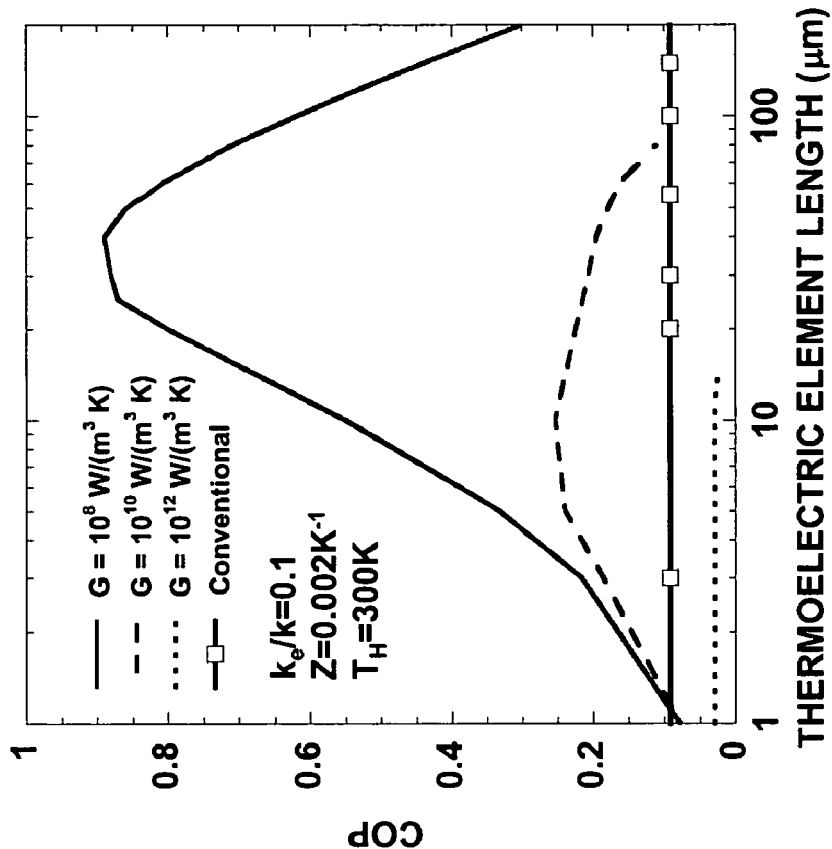

FIG. 10A depicts calculated cooling target temperature changes with thermoelectric element length and the electron-phonon coupling constant under a load of $q=50W/cm^2$.

Figure 10B:
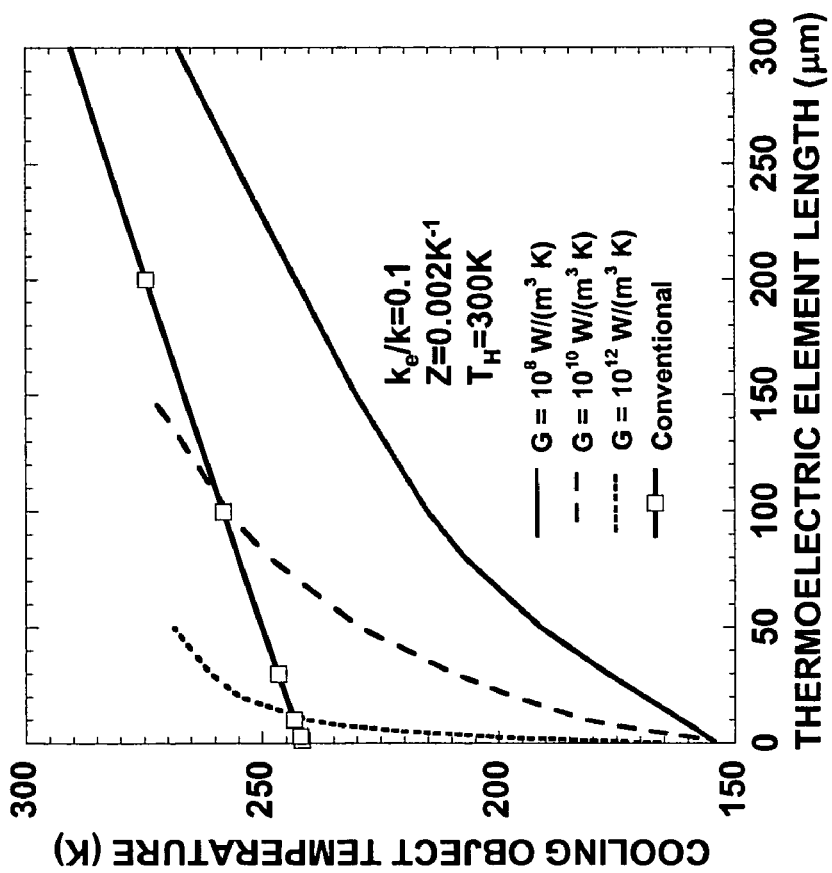

FIG. 10B depicts the COP of surface-plasmon coupled nonequilibrium thermoelectric refrigerator calculated as a function of thermoelectric element length and electron-phonon coupling constant with the cooling target temperature at 250K. For low G value, the COP of surface-plasmon coupled nonequilibrium thermoelectric refrigerator of the invention can be calculated to be much higher than the maximum of a conventional thermoelectric refrigerator.

Figure 11:
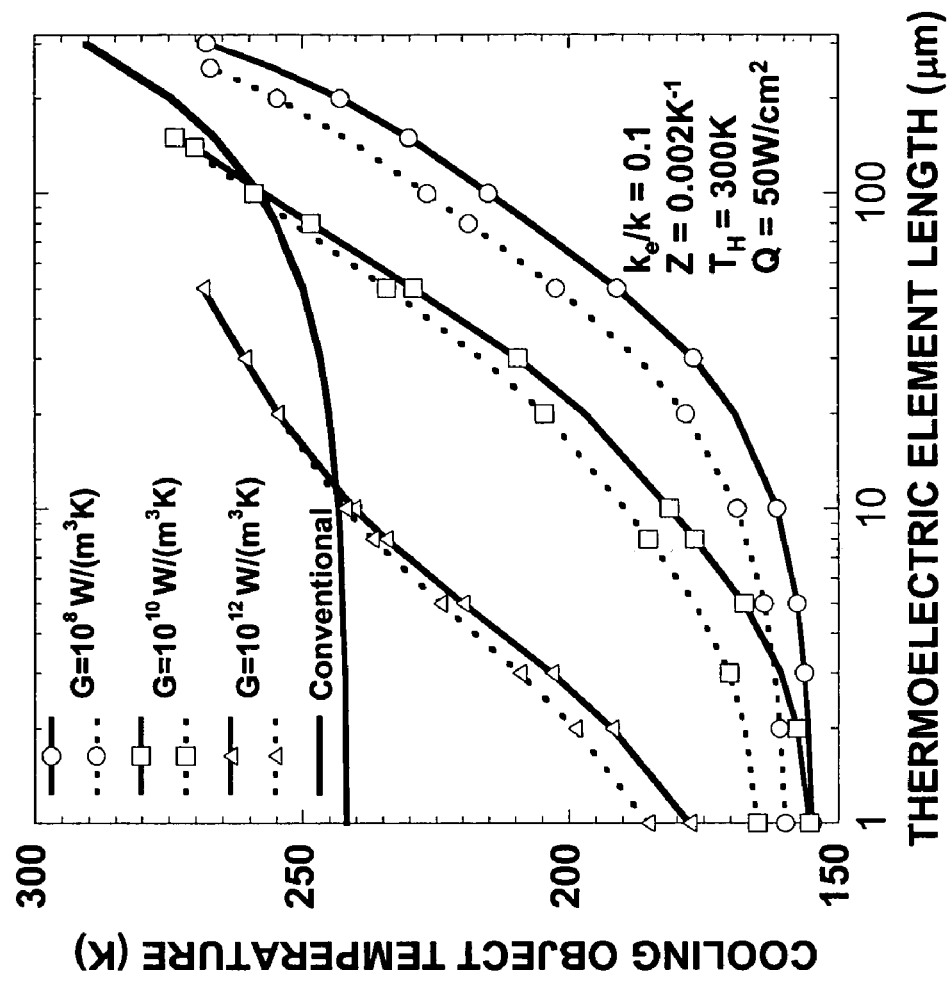

FIG. 11 depicts cooling target temperature calculated with and without the consideration of the reverse energy flow due to surface phonon polariton (dashed lines with symbols—without, solid lines with symbols—with) under a cooling load of $50W/cm^2$. Though the surface phonon polariton can degrade the cooling performance, the surface-plasmon coupled nonequilibrium devices can still be calculated to have much better performance than conventional devices.

Figure 12:
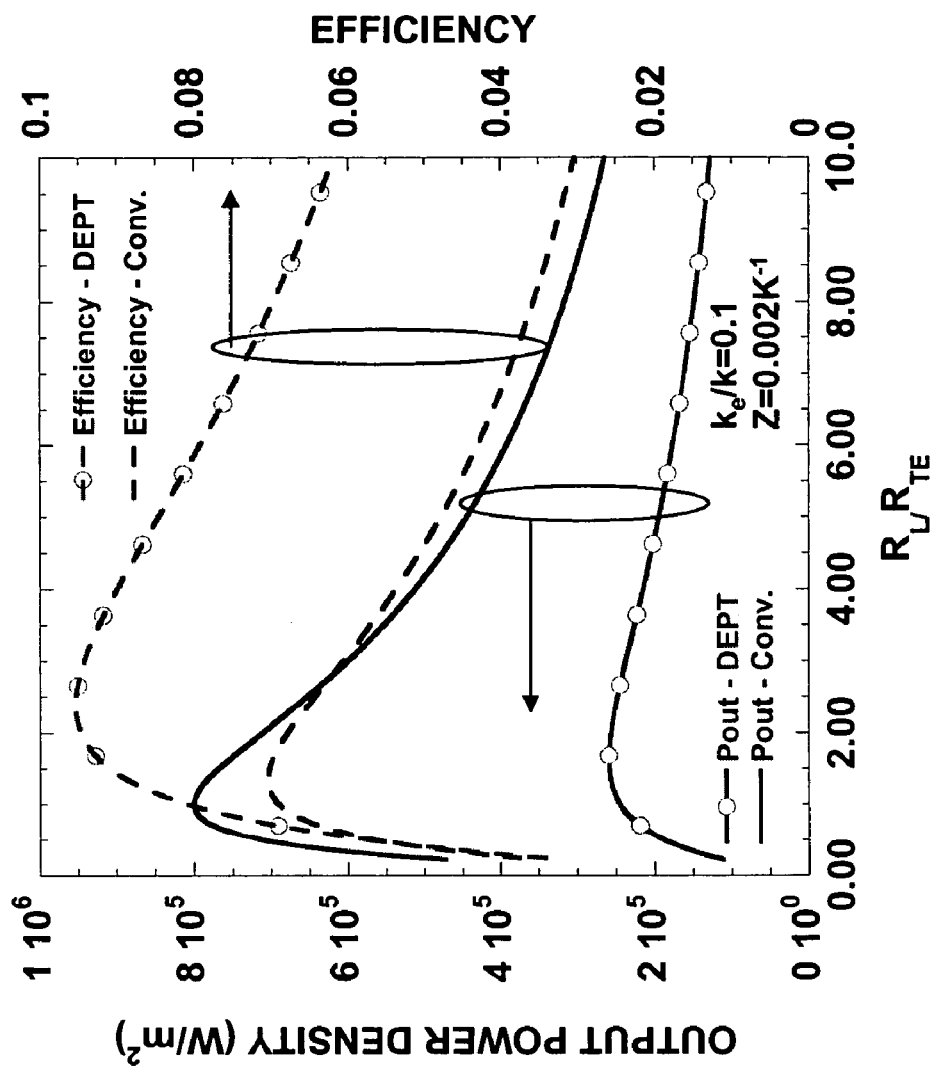

FIG. 12 depicts changes calculated in output power density and energy conversion efficiency with the ratio of the external and internal thermal resistances $\mu=R_L/R_{TE}$. Comparing to the conventional thermoelectric power generator, the surface-plasmon coupled nonequilbrium thermoelectric power generator of the invention can be calculated to have much higher energy conversion efficiency over a wide range of $\mu=R_L/R_{TE}$ than conventional devices.

Figure 13A:
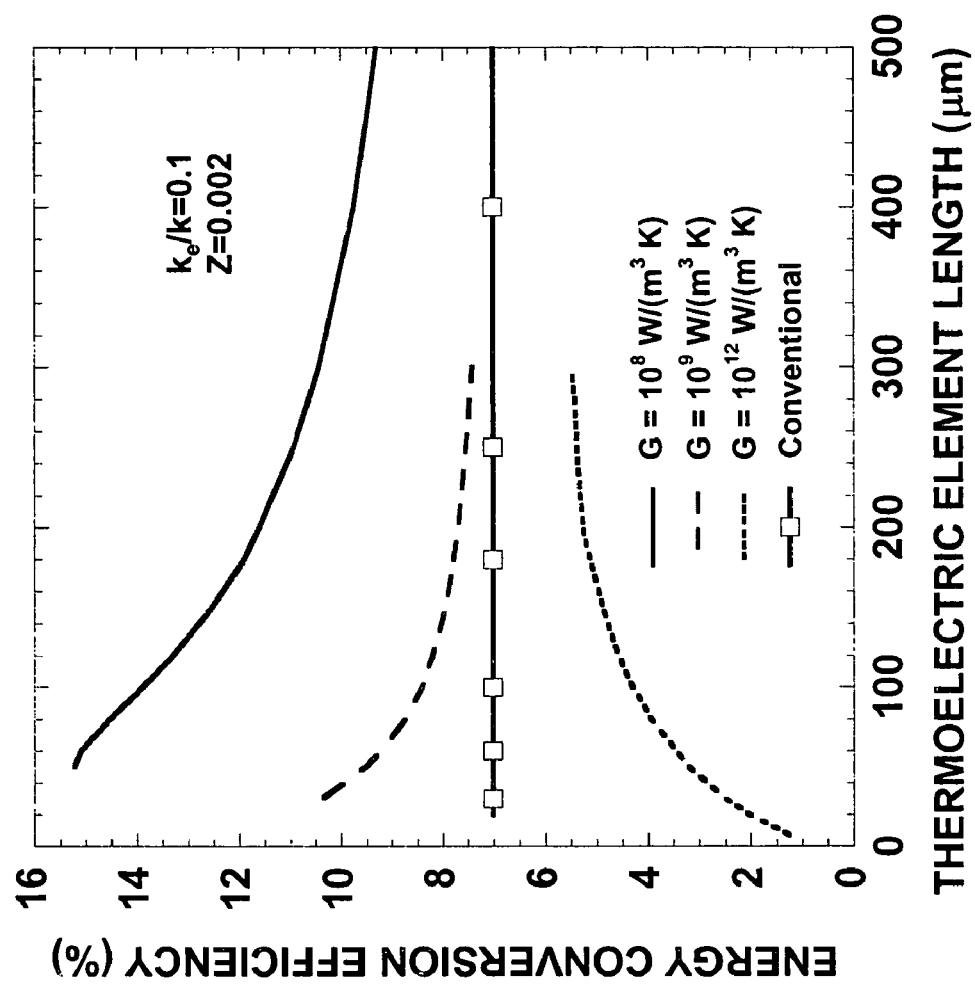
Figure 13:
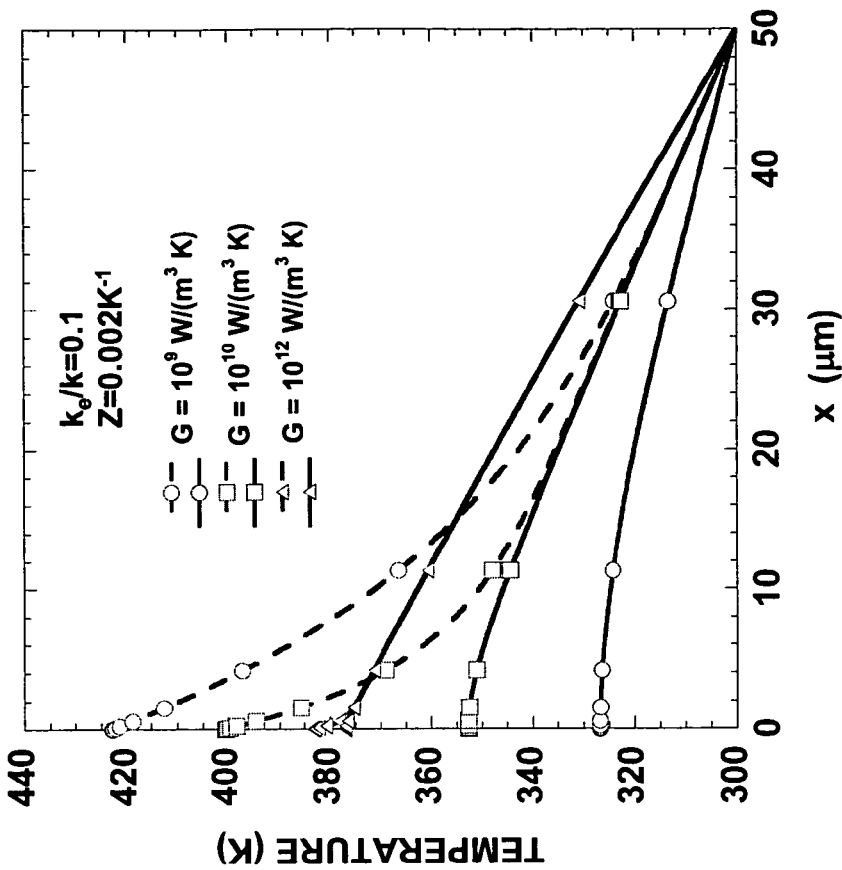

FIG. 13A graphs the calculated optimum energy conversion efficiency as a function of thermoelectric element length for different electron-phonon coupling constant with $k_e/k=0.10$ and $Z=0.002K^{-1}$ operating at $T_1=500K$ and $T_2=300K$.

FIG. 13B graphs the corresponding calculated electron temperature at the hot end of the thermoelectric element.

Figure 13C:
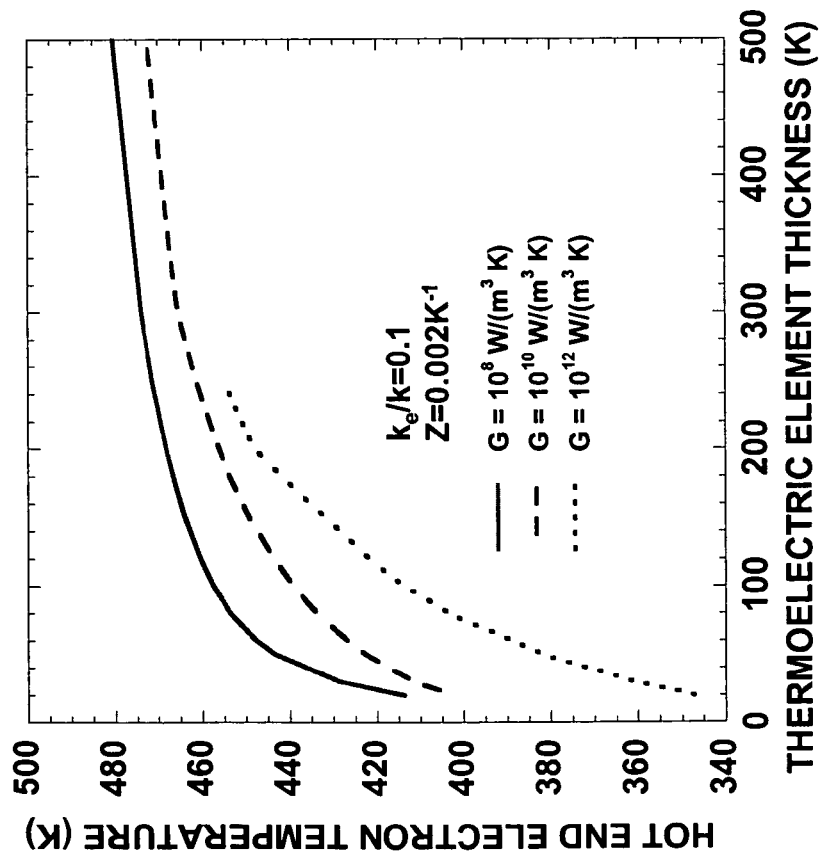

FIG. 13C graphs the electron and phonon temperature distributions calculated for a 50 μm surface-plasmon coupled nonequilibrium thermoelectric power generator when the heat source is maintained at 500K.

Figure 14:
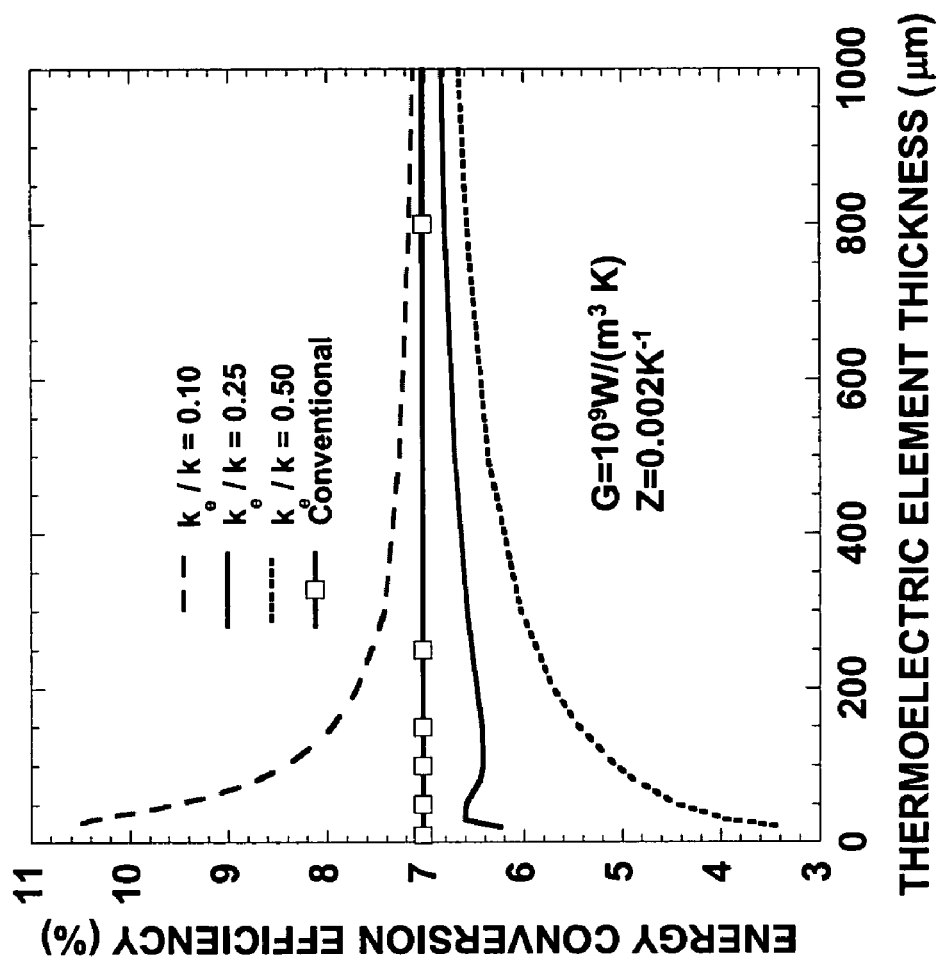

FIG. 14 graphs energy conversion efficiency changes calculated as a function of thermoelectric element length for different $k_e/k$.

FIG. 15 shows a refrigeration device 100 that could be constructed.

FIG. 16 shows a power generation device 200 that could be constructed

DETAILED DESCRIPTION OF THE INVENTION

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

The invention generally relates to devices and methods for efficiently transferring thermal energy via coupled surface-plasmon polaritons, while inhibiting unwanted heat conduction due to phonons, and through the high energy flux of the surface plasmon polaritons, creating the nonequilibrium states of electrons and phonons in the thermoelectric element employed.

FIG. 1A depicts surface-plasmon-coupled thermoelectric apparatus 10. First surface-plasmon substrate 12 opposes a first face of thermoelectric substrate 14, defining phonon insulating gap 18. A plurality of electrodes 16 are electrically coupled to thermoelectric substrate 14. Substrates 12 and 14 are also electrically isolated, i.e., they are electrically insulated from each other.

In the apparatuses depicted schematically herein, e.g., in FIGS. 1A-1D, 1G, 1H, 15, and 16, only a single thermoelectric couple (e.g., the couple of first surface-plasmon substrate 12 and thermoelectric substrate 14 in apparatus 10 of FIG.

1A) is shown. In practical devices, a single thermoelectric couple can be employed, though more typically, a plurality of thermoelectric couples is employed which are connected in series electrically and in parallel thermally.

FIG. 1B depicts apparatus 10 with additional optional components. In some embodiments, optional second surface-plasmon substrate 20 is included, which can be coupled to (e.g., physically contacts) thermoelectric substrate 14, and thus surface-plasmon substrates 12 and 20 define phonon insulating gap 18. Apparatus 10 can optionally be employed in conjunction with thermal reservoirs 22 and 24, which are thermally coupled, e.g., in contact with, first surface-plasmon substrate 12 and thermoelectric substrate 14, respectively. Thus, in operation, thermal energy is transferred between one thermal reservoir to the other. For example, in refrigeration mode, electrical power is applied to thermoelectric substrate 14 to transport heat from reservoir 22 through apparatus 10 to reservoir 24; in power generation mode, heat flows from reservoir 22 through apparatus 10 to reservoir 24, generating power in a load circuit coupled to thermoelectric substrate 14.

Optionally, a thin layer of metal 23 can be placed on a second face of first surface-plasmon substrate 12, i.e., on the face that is to contact the heat source or cooling target, e.g., reservoir 22. Suitable metals can include, for example, copper, silver, gold, aluminum, nickel, zinc, lead, platinum, alloys thereof, and the like.

Many different materials, including conductors, semiconductors, and the like, can support surface-plasmon polaritons. Typically, thermoelectric substrates are semiconductors and semimetals. Generally, thermoelectric substrate 14 and surface-plasmon substrates 12 and 20 are each a semiconductor. In some embodiments, each substrate is an independently selected semiconductor, and can include, for example, InSb, HgCdTe, InAs, $Bi_2Te_3$, SiGe, PbTe, PbSe, HgSe, GaAs, InP, boron carbides, and boron silicides, their related alloys, and the like. More preferably, each substrate can be InSb, HgCdTe, or HgSe.

In some embodiments, surface-plasmon substrates 12 and 20 are the same semiconductor. In other embodiments, surface-plasmon substrates 12 and 20 are different semiconductors.

In some embodiments, second surface-plasmon substrate 20 and thermoelectric substrate 14 are different semiconductors; typically, second surface-plasmon substrate 20 can be applied to thermoelectric substrate 14 by methods known to the art, e.g., sputtering, chemical vapor deposition, evaporation, and the like. In some embodiments, second surface-plasmon substrate 20 and thermoelectric substrate 14 are the same semiconductor; preferably in such embodiments, second surface-plasmon substrate 20 is a doped surface layer of thermoelectric substrate 14, e.g., doped by methods known to the art such as ion implantation, diffusion and the like.

The thickness of phonon insulating gap 18 is generally from about 1 nanometer to about 100 nanometers, and is typically less than about 10% of the wavelength of the surface-plasmon polaritons. More typically, the thickness of phonon insulating gap 18 is between about 10 nanometers and about 100 nanometers. Phonon insulating gap 18 allows the transfer of thermal energy via surface-plasmon polariton coupling, but can tend to partially or completely inhibit or prevent energy transfer due to phonons.

In some embodiments, apparatus 10 includes optional mechanism 40 coupled to the substrates, whereby the thickness of phonon insulating gap can be adjusted. Mechanism 40 can adjust the thickness of the phonon insulating gap 18 with regard to the amount of radiative energy transfer desired between the first surface plasmon substrate and the second plasmon substrate. For example, the thickness of the phonon insulating gap can be varied as a function of temperature and surface plasmon wavelength. Typically, the thickness can be adjusted between about 1 nanometer and about 100 nanometers, more typically between about 10 nanometers and about 100 nanometers.

The energy transfer across the gap can be inversely proportional to the second power of the phonon insulating gap thickness, e.g., which can be approximated for small temperature differences as $q=\alpha(T_1-T_2)/d^2$, where q is the heat transfer, T1 and T2 are the temperature of the surfaces on either side of the gap, d is the gap, and $\alpha$ is a temperature dependent quantity.

For example, the thickness of the phonon insulating gap 18 can be adjusted to compensate for aging of the materials leading to a drift in the surface-plasmon polariton properties, effects of changing or varying temperatures, and the like. Temperature can affect the performance of the device in multiple ways. Thermal expansion (or contraction) due to variation in temperature can cause variations in the phonon insulating gap thickness. In intrinsic semiconductors the conduction electron concentration (valence hole concentration) can increase exponentially with temperature. An increase in electron concentration can lead to an increase in the surface plasmon polariton frequency or decrease in the surface plasmon polariton wavelength. In semiconductors where the doping levels are typically much higher than the intrinsic doping levels, temperature can affect electron concentration to a lesser extent (compared to intrinsic semiconductors) but can affect electron relaxation time strongly. An increase in temperature can lead to a decrease in electron relation time (mean free path), which can lead to an increase in the absorptive part of the dielectric function of the material. In metals, temperature can have a similar effect as in heavily doped semiconductors.

Suitable mechanisms for mechanism 40 are known to the art and are employed in microscopy, semiconductor manufacturing, hard disk drives, precision manufacturing, and the like. These mechanisms include piezoelectric positioning mechanisms, e.g., "inchworm" drives, electric motors coupled to step-down gearing, electrostrictive and magnetostrictive positioning elements and the like. For example, piezo-electric worm-type shifting mechanisms, or piezo-electric motors, can move extremely short distances of the order of a single angstrom, while having a stroke of several tens of millimeters. Scanning tunneling microscopes, for example, employ piezo-electric devices to maintain tip distance from a surface to an accuracy of 1 angstrom. See, for example, U.S. Pat. No. 4,423,347 to Kleinschmidt et al. which discloses an electrically actuated positioning element formed of piezo-electric bodies; U.S. Pat. No. 5,351,412 to Furuhata and Hirano which discloses a device which provides sub-micron positioning; U.S. Pat. No. 5,049,775 to Smits which discloses an integrated micro-mechanical piezo-electric motor or actuator. Electostrictive and magnetostrictive positioning elements include, for example, Razzaghi (U.S. Pat. No. 5,701,043) which teaches a high-resolution actuator using a magnetostrictive material able to achieve displacements with sub-nanometer resolution and a range of about 100 microns; Visscher (U.S. Pat. No. 5,465,021) which discloses an electromechanical displacement device which uses piezo-electric, electrostrictive or magnetostrictive clamping and transport elements; Kondou (U.S. Pat. No. 5,083,056) which discloses an improved circuit for controlling a bimorph-type electrostriction actuator; and Hattori (U.S. Pat. No. 4,937,489) which discloses an electrostrictive actuator for controlling fine angular adjustments of specimens under microscopic scrutiny. Also, Tavkhelidze et al (U.S. Pat. No. 6,720,704) teaches the preceding mechanisms in conjunction with adjustable electrodes on a thermionic vacuum diode device. The entire teachings of these references are included herein by reference.

Phonon insulating gap 18 can typically be sealed from the environment external to apparatus 10. In some embodiments, the gap is a sealed vacuum typically having a pressure less than about 0.01 Torr, generally less than about 0.001 Torr, more typically less than about 0.0001 Torr, or in some embodiments less than about 0.00001 Torr.

In some embodiments, phonon insulating gap 18 is a gap sealed with an inert gas, e.g., any gas that does not appreciably react with or degrade the materials of the apparatus. Typical inert gases can include nitrogen, noble gases (e.g., helium, neon, argon, krypton, radon, and the like), or depending on the materials of the apparatus, can include methane, ethane, propane, and the like. Generally, inert gases include nitrogen and noble gases, preferably heavier noble gases such as argon or krypton. The amount of gas used is such that at a given temperature (for example, at 25° C., or preferably at the operating temperature of the gap during operation of the apparatus), less than about 1% of the heat transfer across the gap is due to the inert gas (e.g., due to thermal energy transferred via kinetic energy of the gas molecules by collisions with each other and with the surfaces across the gap) compared to that due to surface plasmon radiative energy flux across the gap.

In some embodiments, phonon insulating gap 18 includes a point contact array, e.g., a gap that includes microscopic features which extent across the gap, but contact one or both opposing surfaces in a minimum surface area contact fashion that can tend to minimize, though not eliminate, thermal energy transfer through phonons. Such features can include, for example, raised bumps (e.g., hemispheres, pyramids, pins, and the like) on one or both surfaces, or independent features (spherical particles, rods, and the like) trapped between the surfaces. Such point contact array features are known to the art; see, for example, Ghoshal et al (U.S. Pub. Pat. 2002/0166839); Ghoshal et al, Appl. Phys. Lett. 80, 2002, 3006-3008; Kucherov et al (U.S. Pub. Pat. 2004/0050415); and Kucherov et al ((U.S. Pub. Pat. 2003/0184188); the entire teachings of these documents are incorporated herein by reference.

In some embodiments, phonon insulating gap 18 can include or can be occupied by one or more pieces or layers of an insulator, e.g., typically insulators known as aerogels, and the like (e.g., available from Aspen Aerogels, Northampton, Mass.).

In some embodiments, the various aspects of phonon insulating gap 18 can be combined, for example, the point contact array can be employed as a sealed vacuum gap, the point contact array can be employed sealed with an inert gas, the aerogel can be employed as a sealed vacuum gap, the aerogel can be employed sealed with an inert gas, and the like. Other variations will be apparent to one skilled in the art.

FIG. 1C depicts apparatus 10 equipped to operate in a refrigeration mode, wherein optional power supply 26 can be connected to electrodes 16. For purposes of illustration, the relative temperature of various components is graphed directly on the component. For example, during operation, optional thermal reservoir 22 can typically be brought to a lower temperature $T(22)$ than optional thermal reservoir 24 at temperature $T(24)$. By applying power from supply 26 to thermoelectric substrate 14, a nonequilibrium state is created between the electron temperature $T(14e)$ and the phonon temperature $T(14p)$ at a first face 32 of thermoelectric substrate 14, i.e., in refrigeration mode, $T(14e)$ at first face 32 is less than $T(14p)$. When second surface-plasmon substrate 20 is employed, it can be thin enough that the nonequilibrium state between $T(14e)$ and $T(14p)$ is substantially the same as at face 32. Thus, coupling a surface-plasmon polariton 34 with electrons in thermoelectric substrate 14, when $T(14e)$ is less than the temperature $T(12)$ of first plasmon substrate 12 can transfer thermal energy across phonon insulating gap 18. Typically, the cooling target is thermal reservoir 22, and operation of apparatus 10 cools reservoir 22 by transferring thermal energy via surface-plasmon polariton 34, to electrons in thermoelectric substrate 14, and then to thermal reservoir 24. In embodiments where second surface-plasmon substrate 20 is employed, first surface-plasmon polariton 34 couples with second surface plasma polariton 36, and from there to electrons in thermoelectric substrate 14. First surface-plasmon substrate 12 and second surface-plasmon substrate 20 can be each a metal, a semimetal or a semiconductor. Substrate 14 can be a semimetal or a semiconductor. Typically, substrates 12, 14, and 20 are each a semiconductor.

Figure 1D:
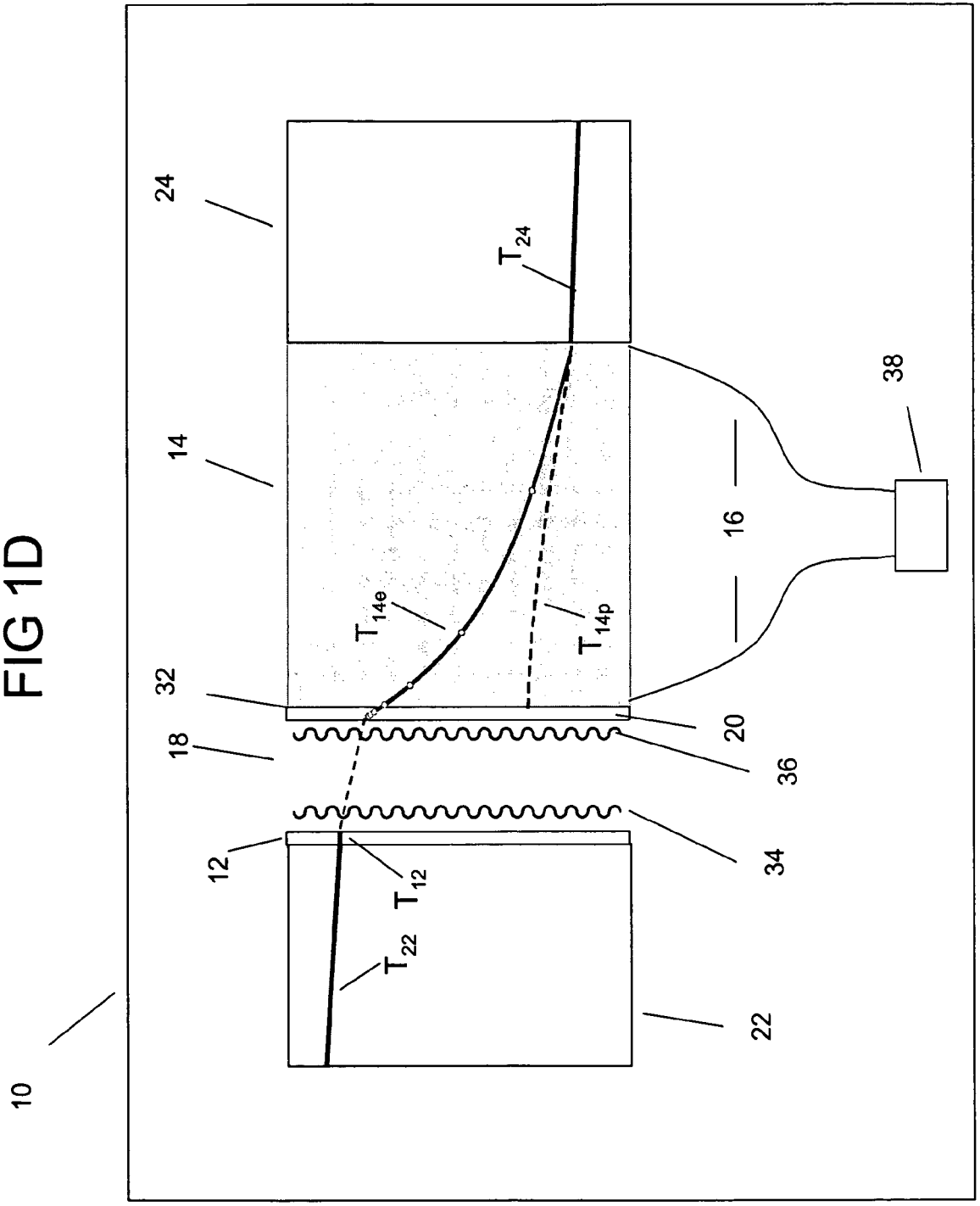
FIG. 1D shows an embodiment of apparatus 10 of the invention equipped to operate in a power generation mode, where load circuit 38 can be connected to electrodes 16.

FIG. 1D shows an embodiment of apparatus 10 equipped to operate in a power generation mode, where load circuit 38 can be connected to electrodes 16. As above, for purposes of illustration, the relative temperature of various components is graphed directly on the component (for convenience of illustration it is assumed that no temperature drop occurs in the thermal reservoirs). For example, optional thermal reservoir 22 can be a heat source, e.g., typically it is at a higher temperature $T(22)$ compared to optional thermal reservoir 24 at temperature $T(24)$. By applying load circuit 38 to thermoelectric substrate 14, when $T(22)$ is greater than temperature than $T(24)$, a nonequilibrium state is created between electron temperature $T(14e)$ and phonon temperature $T(14p)$ at first face 32 of thermoelectric substrate 14, e.g., in power generation mode, $T(14e)$ is greater than $T(14p)$. Thus, coupling a first surface-plasmon polariton 34 with electrons in thermoelectric substrate 14, when the temperature $T(12)$ of first surface-plasmon substrate 12 is greater than $T(14e)$ can allow transfer of thermal energy across phonon insulating gap 18 and generate power in load circuit 38 coupled to thermoelectric substrate 14. Typically, the voltage generated can be proportional to the difference between $T(14e)$ and $T(24)$ in conjunction with the difference between $T(12)$ and $T(24)$ in load circuit 38. Thus, the phonon heat conduction contribution to the total heat transferred from the heat source (which can be detrimental to performance of the device) can be reduced, thus the efficiency can be enhanced, because the difference between $T(14p)$ and $T(24)$ can be less (in some instances much less) than the difference between $T(14e)$ and $T(24)$. As above, in embodiments where optional second surface-plasmon substrate 20 is employed, first surface-plasmon polariton 34 couples with second surface plasma polariton 36, and from there to electrons in thermoelectric substrate 14. Typically, substrates 12, 14, and 20 are each a semiconductor.

Figure 1F:
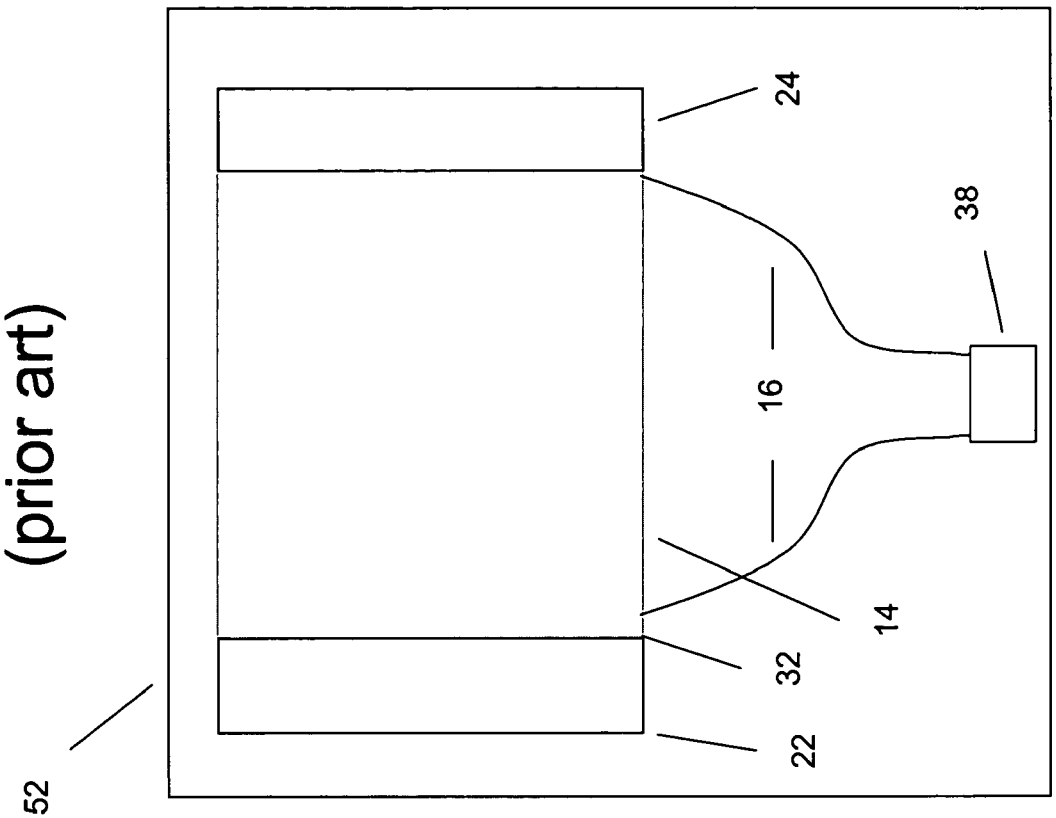
FIGS. 1E and 1F depict schematic drawings of prior art thermoelectric devices that can be used to calculate the relative efficiency of the disclosed surface-plasmon coupled devices.
Figure 1E:
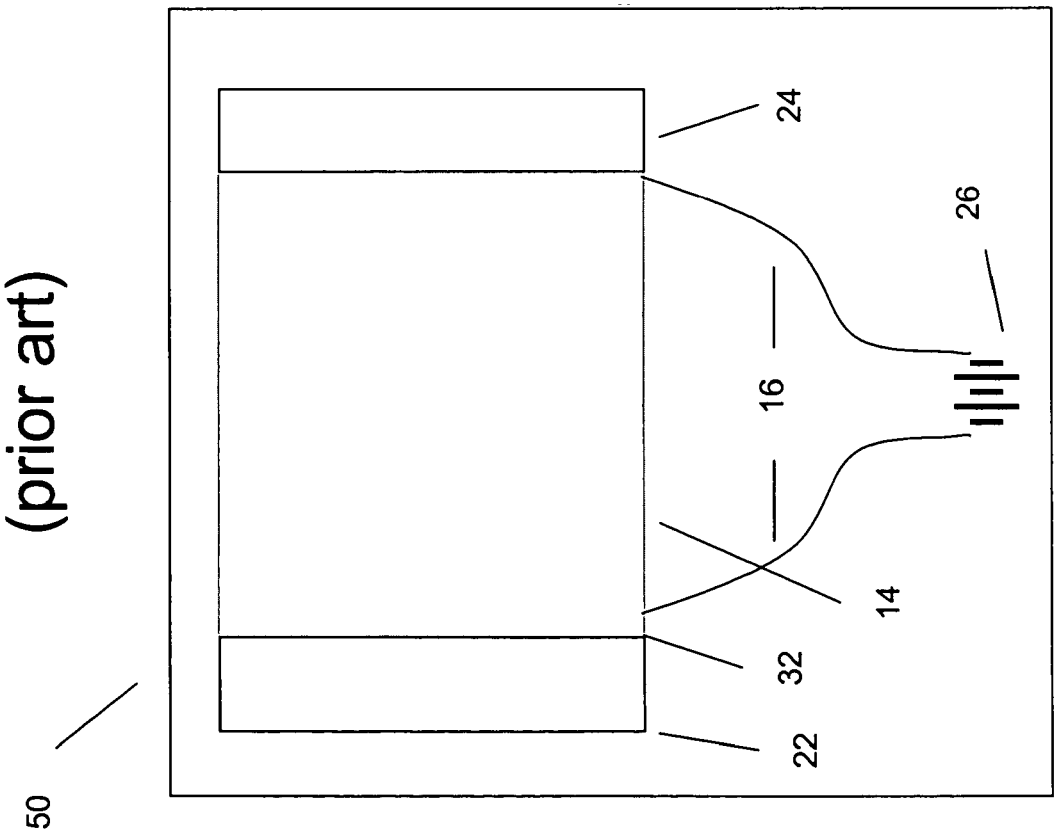

The apparatus can be operated efficiently in various embodiments. For example, apparatus 10 can be operated in a refrigeration mode to refrigerate thermal reservoir 22. The refrigeration efficiency, or Coefficient of Performance(COP) of apparatus 10 in this mode can be compared to a comparison refrigeration device that is identical to apparatus 10 except that it lacks phonon insulating gap 18 and plasmon substrates 12 and 20. For example, comparison refrigeration device 50 is shown in FIG. 1E, consisting of thermoelectric substrate 14, electrodes 16, and power supply 26. The comparison refrigeration device can be thermally coupled to first and second thermal reservoirs 22 and 24 so that they contact opposite sides of thermoelectric substrate 14, with thermal reservoir 22 contacting first face 32 of thermoelectric substrate 14. Details of calculating COP for performance comparisons in refrigeration mode are provided in the Exemplification.

Also, in some embodiments, apparatus 10 can be operated in a power generation mode. The power generation efficiency of apparatus 10 in this mode can be compared to a comparison refrigeration device that is identical to 10 except that it lacks phonon insulating gap 18 and plasmon substrates 12 and 20. For example, comparison power generation device 52 is shown in FIG. 1F, consisting of thermoelectric substrate 14, electrodes 16, and load circuit 38. The comparison power generation device can be thermally coupled to first and second thermal reservoirs 22 and 24 so that they contact opposite sides of thermoelectric substrate 14, with thermal reservoir 22 contacting first face 32 of thermoelectric substrate 14. Details of calculating COP for performance comparisons in power generation mode are provided in the Exemplification.

The Exemplification section below provides further details of estimating device performance, selecting device parameters and materials, and examples of devices that can be constructed.

EXEMPLIFICATION

While not wishing to be bound by theory, it can be helpful to understand the embodiments herein by considering a theoretical model which can be employed to estimate device performance, select desired device parameters and materials, and provide other guidelines for constructing the devices of the invention. Thus, it is to be understood that the material in this section and in the figures referenced therein represent results calculated from the theoretical model rather than experimental data.

Direct energy conversion between heat and electricity using thermoelectric effects such as the Seebeck for power generation and the Peltier effect for refrigeration has been studied extensively (A. F. Ioff, *Semiconductor Thermoelements and Thermoelectric Cooling* (Info-search, London, 1956); T. C. Harman and J. M. Honig, *Thermoelectric and Thermomagnetic Effects and Applications* (MacGraw-Hill, New York, 1967); H. J. Goldsmid, *Electronic Refrigeration* (Pion Ltd., London, 1986); D. M. Rowe, *CRC Handbook of Thermoelectrics* (CRC Press, Inc., 1995); G. S. Nolas, J. W. Sharp and H. J. Goldsmid, *Thermoelectrics: Basics Principles and New Materials Developments* (Springer-Verlag, Berlin, 2001); Tritt, T. M. Ed., Semiconductors and Semimetals 69-71 (2001)).

In a thermoelectric device, three competing processes can occur simultaneously: the useful Peltier effect or Seebeck effect, the volumetric Joule heating, and heat conduction from the hot end to the cold end. Device analysis shows that the performance of thermoelectric devices can be determined by the materials figure of merit, $Z=S^2\sigma/k$, where S is the Seebeck coefficient, $\sigma$ is the electrical conductivity, and k is the thermal conductivity. The thermal conductivity can have contributions from both electrons and phonons, e.g., $k=k_e+k_p$, where $k_e$ and $k_p$ are electron and phonon thermal conductivities respectively. Most research in thermoelectrics has focused on improving the figure of merit (T. C. Harman, P. J. Taylor, M. P. Walsh, and B. E. LaForge, Science 297, 2229 (2002); R. Venkatasubramanian, E. Silvona, T. Colpitts, and B. O'Quinn, Nature 413, 597 (2001); Kuei Fang Hsu, Sim Loo, Fu Guo, Wei Chen, Jeffrey S. Dyck, Ctirad Uher, Tim Hogan, E. K. Polychroniadis, and Mercouri G. Kanatzidis, Science 303, 818 (2004)). In addition to the materials development, different device configurations have been explored including the investigation of thermoelectric effects in pn junctions and minority carrier effects, multistage thermoelectric devices, and transient effects (A. Shakouri, and J. E. Bowers, Appl. Phys. Lett., 71, 1234 (1997); G. D. Mahan and L. M Woods, Phys. Rev. Lett. 80, 4016 (1998); C. B. Vining and G. D. Mahan, J. Appl. Phys., 86, 6852 (1998)). Recent examples are thermionic refrigeration and power generation based on single and multilayer structures (J. Tauc, *Photo and Thermoelectric Effects in Semiconductors* (Pergamon Press, New York, 1962); K. P. Pipe, R. J. Ram, and A. Shakouri, Phys. Rev. B 66, 125316 (2002); B. J. O'Brien, C. S. Wallace and K. Landecker, J. Appl. Phys. 27, 820 (1956); P. W. Cowling and J. E. Sunderland, Energy Conversion 7, 289 (1968); R. G. Yang, G. Chen, G. J. Snyder, and J.-P. Fleurial, J. Appl. Phys. (in Press); G. J. Snyder, J.-P. Fleurial, T. Caillat, R. Yang, and G. Chen, J. Appl. Phys. 92, 1564 (2002) and references therein).

In thermoelectric devices, it is believed that electrons do the useful energy conversion work and thus the electron temperature can be important for energy conversion efficiency. Existing examples of imparting energy preferentially to electrons are the vacuum thermionic power generators and electron tunneling refrigerators (G. N. Hatsopoulos, and J. Kaye, J. Appl. Phys. 29, 1124 (1958); F. N. Huffman, U.S. Pat. No. 3,169,200 (1965); Y. Hishinuma, T. H. Geballe, B. Y. Moyzhes, T. W. Kenny, J. Appl. Phys. 94, 4690 (2003); Appl. Phys. Lett. 78, 2572 (2001)).

Electron thermionic emission, however, can be limited by the work function of available materials, and electron tunneling can require extremely small gaps, on the order of several angstroms. An alternative way to decouple electrons and phonons can be to explore thermal radiation between two surfaces, for example, using photons to transfer the energy from the heat source to electrons in the power generation unit. Along this line, one apparent way of utilizing such an effect can be to use a thermophotovoltaic converter in which photovoltaic cells convert the energy of the photons emitted by a heat source into useful electrical energy (T. J. Coutts, Renewable Sustainable Energy Rev. 3, 77 (1999)). Thermophotovoltaic converters, however, can be limited to photons emitted by the heat source with energy above the bandgap.

It has been long recognized that the nonequilbrium between electrons and phonons in the thermoelectric element can be exploited to improve the thermoelectric energy conversion efficiency, but there appear to exist no easy ways to create such nonequilibrium states between electrons and phonons to benefit from hot electrons for power generation or to benefit from the cold electrons for refrigeration. (V. S. Zakordonests and G. N. Logvinov, Semiconductors 31, 265 (1997); Yu G. Gurevich and G. N. Logvinoz, Sov. Phys. Semicond. 26, 1091 (1992); Y. G. Gurevich, O. L. Mashkevich, Phys. Rep. (Rev. Sec. Phys. Lett.) 181, 327 (1989); L. P. Bulat and V. G. Yatsyuk, Sov. Phys.-Semicond. 18, 383 (1984); L. I. Anatychuk, L. P. Bulat, D. D. Nikirsa, and V. G. Yatsyuk, Sov. Phys.-Semicond. 21, 206 (1987); L. P. Bullat, Thermoelectricity under large temperature gradients, J. Themoelect. 4, 3 (1997); G. Chen and T. Zeng, Microscale Thermophyis. Eng. 5, 71 (2001)). Taking power generation as an example, to use thermal radiation to take the advantage of the nonequilibrium between electrons and phonons, a small thermal radiation resistance can be needed (1) to provide high energy flux to compensate the electron energy loss to phonons and thus create the nonequilibrium states between electrons and phonons, and (2) to reduce the temperature drop between the heat source and electrons in the thermoelectric element. The heat flux through far-field thermal radiation is generally too small to create nonequilibrium between electrons and phonons. Recent work on phonon-polariton coupling in the near-field shows that a heat flux as high as tens of hundreds of W/cm² can be obtained when two half-spaces of polar semiconductor (such as silicon carbide or boron nitride) can be separated by a nanoscale vacuum gap for a temperature difference of tens of degrees K between the two surfaces (A. Narayanaswamy and G. Chen, Appl. Phys. Lett. 83, 3544 (2003)).

Radiative energy transfer between two surfaces separated by more than a few characteristic wavelengths, as given by Wien's displacement law, can be too small to create significant non-equilibrium effects between electrons and phonons in the thermoelectric element. Tunneling of normal evanescent waves can give rise to an enhancement in the radiative energy transfer, with a maximum radiative flux calculated proportional to $n^2$ times of that of the blackbody flux in vacuum, where n represents the material refractive index (E. G. Cravalho, C. L. Tien, and R. P. Caren, ASME J. Heat Transf. 89, 351 (1967); D. Polder and M. Van Hove, Phys. Rev. B 4, 3303 (1971); M. D. Whale, *A fluctuational electrodynamic analysis of microscale radiative heat transfer and the design of microscale thermophotovoltaic devices*, Ph. D. thesis, (MIT, Cambridge, 1997); R. S. DiMatteo, P. Greiff, S. L. Finberg, K. Young-Waithe, H. K. H. Choy, M. M. Masaki, and C. G. Fonstad, Appl. Phys. Lett. 79, 1894 (2001)). Although the possibility of employing this enhancement for thermophotovoltaic energy conversion has been studied theoretically as well as experimentally, the increase in heat flux is still not believed sufficient for the current application. On the other hand, it has been found recently that coupling of electromagnetic surface waves, such as surface phonon-polaritons, can lead to an enhancement of radiative flux orders of magnitude higher than that of the blackbody limit. The possibility of utilizing this effect for thermophotovoltaic energy conversion has been analyzed theoretically using materials that support surface phonon-polaritons (R. Carminati and J.-J. Greffet, Phys. Rev. Lett. 82, 1660 (1999); A. Narayanaswamy and G. Chen, Appl. Phys. Lett. 83, 3544 (2003)). However, this method still can have energy transfer due to phonons that can transfer additional heat from the heat source to the cold reservoir in power generation mode or transfer heat from the hot reservoir to the cooling object in refrigeration mode.

Theoretical Model

The present invention contemplates obtaining better performance of thermoelectric devices by imparting energy preferentially to electrons (by inhibiting the energy transport through phonons between the heat source or the cooling target and the thermoelectric element) while minimizing the energy coupling between electrons and phonons. It is calculated herein that near-field energy transfer due to surface-plasmons can improve on the phonon-polariton coupling described in A. Narayanaswamy and G. Chen, ibid, because (it is believed) only electrons (or plasmons) participate in the energy exchange between the surface plasmon substrates.

Without wishing to be bound by theory, models are disclosed herein to demonstrate by way of calculated examples the potential of surface-plasmon coupled nonequilibrium thermoelectric refrigerators and power generators. In this section ("Theoretical Model"), exemplary models are disclosed for surface-plasmon-coupled nonequilibrium thermoelectric devices, including surface-plasmon energy transport model across a nanoscale vacuum gap and nonequilibrium electron-phonon energy transport model in the thermoelectric device. Also disclosed are exemplary criteria for material property selection. The "Calculation" section discloses calculation results for refrigerators and power generators. The "Examples" disclose specific examples of a refrigeration apparatus and a power generation apparatus of the disclosed invention that can be designed according to the teachings of the theoretical model.

Figure 1H:
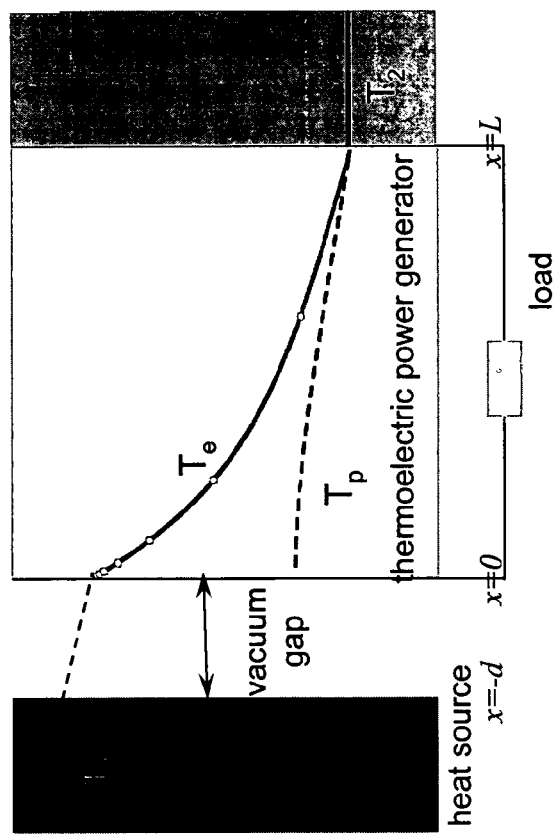
FIGS. 1G and 1H depict schematic drawings of surface-plasmon coupled nonequilibrium thermoelectric devices of the invention.
Figure 1G:
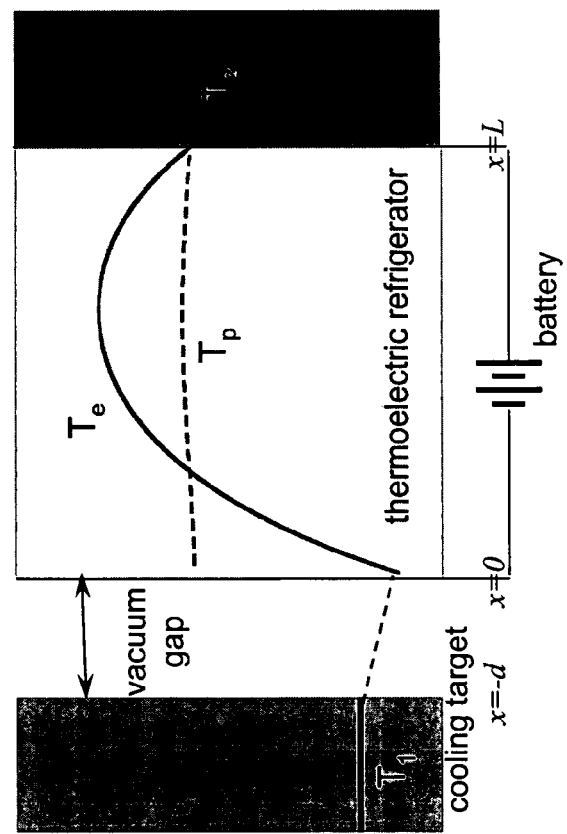

FIGS. 1G and 1H illustrate schematically a surface-plasmon coupled nonequilibrium thermoelectric refrigerator and power generator, respectively, of the invention. A nanoscale vacuum can be employed as a phonon insulating gap to avoid the direct contact of heat source or cooling target from thermoelectric element, and thus cutting-off the heat flow through phonons between the heat source or the cooling target and the thermoelectric element. The vacuum gap can range from about 1 nm to about 100 nm and can achieve surface wave high radiative energy flux. The cooling target in a refrigerator or the heat source in a power generator can be a material that supports surface-plasmon polaritons or can be coated with a thin film of a material that can support surface-plasmon polaritons. Similarly, the side of the thermoelectric element facing the cooling target or heat source can also be coated with a thin film of such a material, typically the same material as the first surface plasmon substrate, or can be a thin doped layer of the thermoelectric material to support the surface plasmon. Having the same material on both sides of the vacuum gap can lead to increased energy transfer (compared to using different materials) due to surface-plasmons. Also illustrated in FIGS. 1G and 1H are typical calculated electron and phonon temperature distributions in the devices, which will be described in detail below.

Surface-Plasmon Energy Transport Model

The radiative energy transfer between the heat source (or cooling target) and the thermoelectric element by surface-plasmons can be modeled following the method used to model energy transfer due to surface phonon-polaritons, using a combination of dyadic Green's function technique and the fluctuation-dissipation theorem to characterize the spectral strength of the thermal sources (A. Narayanaswamy and G. Chen, Appl. Phys. Lett. 83, 3544 (2003); L. Tsang, J. A. Kong, and K. H. Ding, Scattering of Electromagnetic Waves (Wiley, 2000); S. M. Rytov, Y. A. Kravtsov, and V. I. Tatarski, *Principles of Statistical Radiophysics*, Vol. 3 (Springer, Berlin, 1987)).

Doped semiconductors with high electron or hole mobilities can support surface-plasmon waves. A n-type semiconductor with the following dielectric function can be assumed for this model:

$$\varepsilon(\omega) = \varepsilon_\infty - (\varepsilon_{DC} - \varepsilon_\infty)\left(\frac{\omega_{TO}^2}{\omega^2 - \omega_{TO}^2 + i\omega\gamma_p}\right) - \frac{\omega_p^2}{\omega(\omega + i\gamma_e)}. \quad (1)$$

The first term on the right hand side of Eq. (1) represents atomic polarization, the second term represents the optical phonons, and the third term represents the conduction electrons. By way of example, parameters can be selected that are close to that of InSb, with $\varepsilon_\infty$=15.24, $\varepsilon_{DC}$=17.76, $\omega_{TO}$=0.022 eV, $\gamma_p$=3.56×10$^{-4}$ eV (P. P. Paskov, J. Appl. Phys. 8, 1890 (1997)).

Figure 2A:
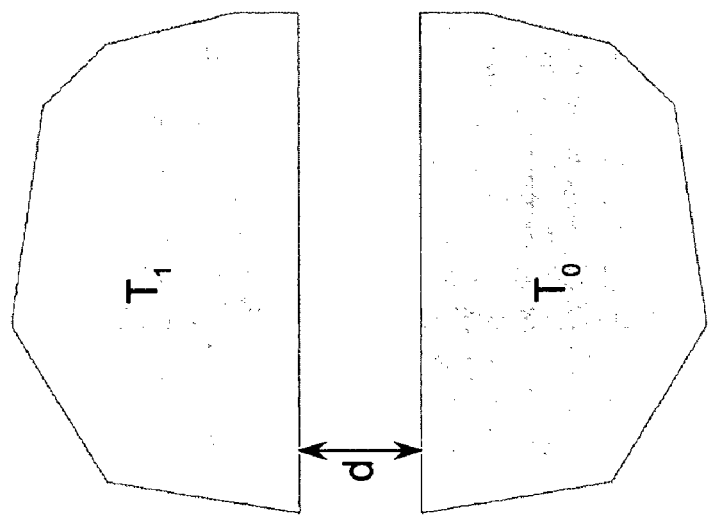
FIG. 2A depicts a schematic of half-spaces of InSb separated by a vacuum gap of thickness d.
Figure 3:
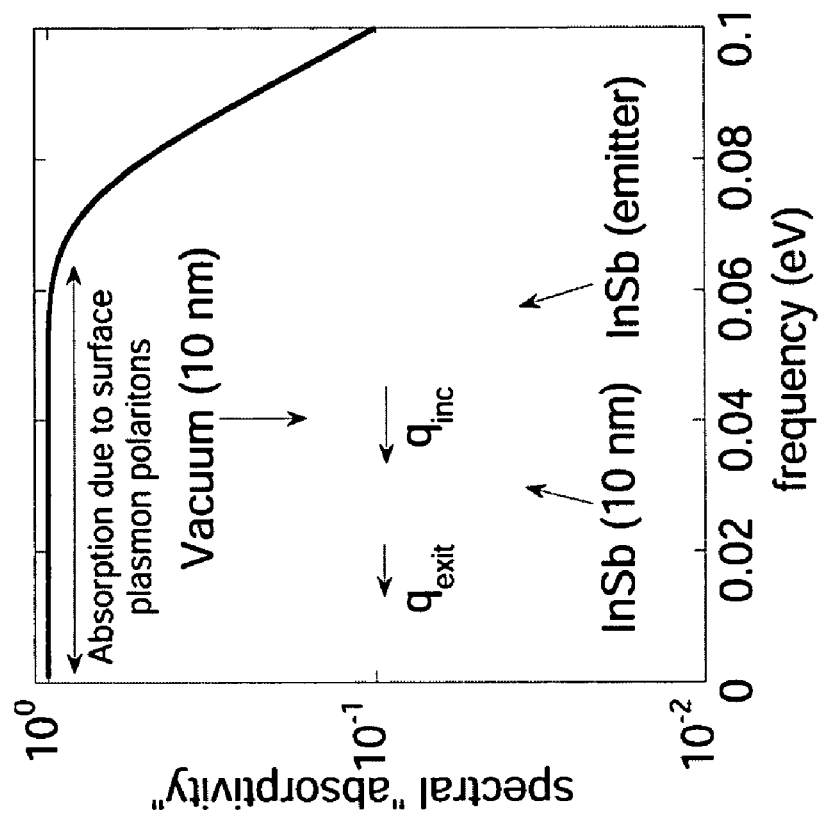
FIG. 3 depicts spectral "absorptivity" calculated for a 10 nanometer (nm) film of InSb separated from a InSb half space (emitter) by a 10 nm layer of vacuum. "Absorptivity" is defined as the ratio $(q_{inc}-q_{exit})/q_{inc}$. Only 10 nm of InSb calculated to be necessary to absorb all the surface-plasmon polariton energy flux.

The plasma frequency can be related to the doping by $$\omega_p^2 = \frac{ne^2}{m_{eff}\varepsilon_o} \quad (2)$$

where n is the electron concentration, $m_{\mathit{eff}}$ is the effective mass of the electrons, and $\in_0$ is the electrical permittivity of free space. The effect of doping on the radiative transfer can be to vary the plasma frequency, $\omega_p$, and the damping, $\in_e$. The heat source (or cooling target) and the thermoelectric element can be modeled as two half-spaces that have the same plasmon frequency as shown in FIG. 2A. For comparison, the spectral "absorptivity" calculated for a 10 nm thin film of InSb adjacent to a half-space of InSb is shown in FIG. 3. The emitter is a half-space of InSb. Almost the entire energy incident on the thin film in the spectral range corresponding to transfer by plasmons can be calculated to be absorbed in this very thin layer. As long the major part of radiative energy transfer can be due to surface-plasmon polaritons, the semi-infinite body approximation can be valid since the penetration depth of surface-plasmons can typically be only about 10 nm.

Figure 4:
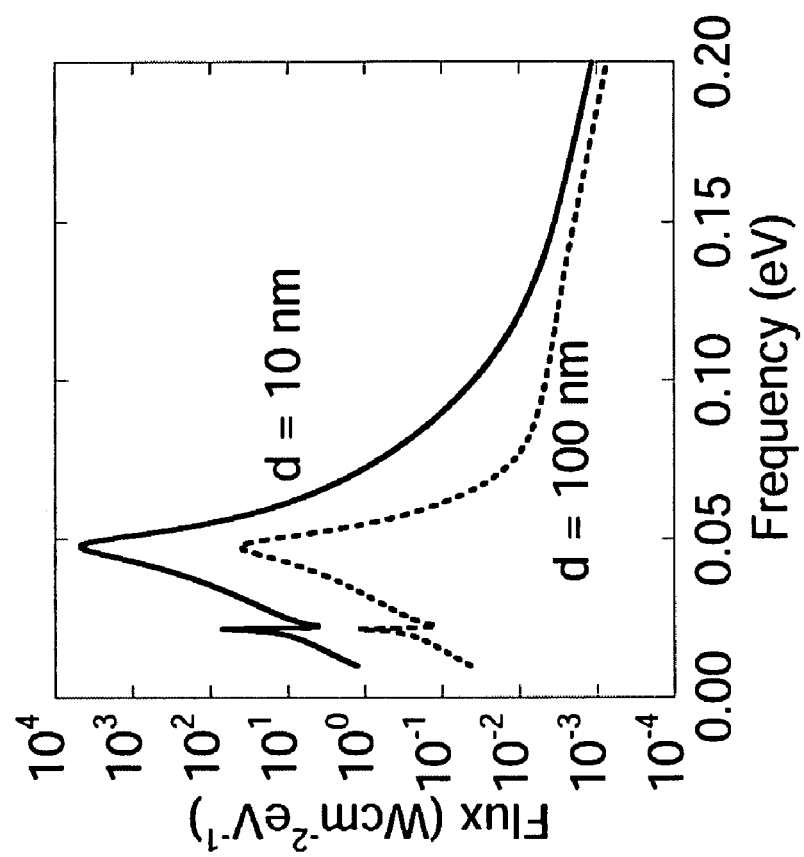
FIG. 4 depicts spectral flux calculated for two half-spaces of InSb separated by a vacuum gap of thickness d=10 nm and d=100 nm. The plasma frequency is assumed to be 0.18 eV. The smaller peak corresponds to resonance due to surface phonon polaritons and the bigger peak corresponds to resonance due to surface-plasmon polaritons.

FIG. 4 shows the spectral flux transfer calculated between two half-spaces of InSb, with $\omega_p$=0.18 eV and $\gamma_e$=5.33 meV, at 400 K and 390 K with a vacuum gap in-between them. The two peaks in FIG. 4 can correspond to resonances due to surface waves. The smaller peak, which can occur around the surface phonon-polariton frequency, can be due to the surface phonon polariton and the main peak, which can occur around the surface-plasmon polariton frequency, can be due to the surface-plasmon of the conduction electrons. In typical embodiments, only radiative transfer by surface-plasmons is desired. By doping InSb appropriately, the fraction of energy transfer due to phonons can be reduced. To do so, it can be desirable to separate the surface-plasmon polariton frequency from the surface phonon polariton frequency. In addition, the optimum surface plasmon frequency can also bedetermined by the temperatures involved.

Figure 5:
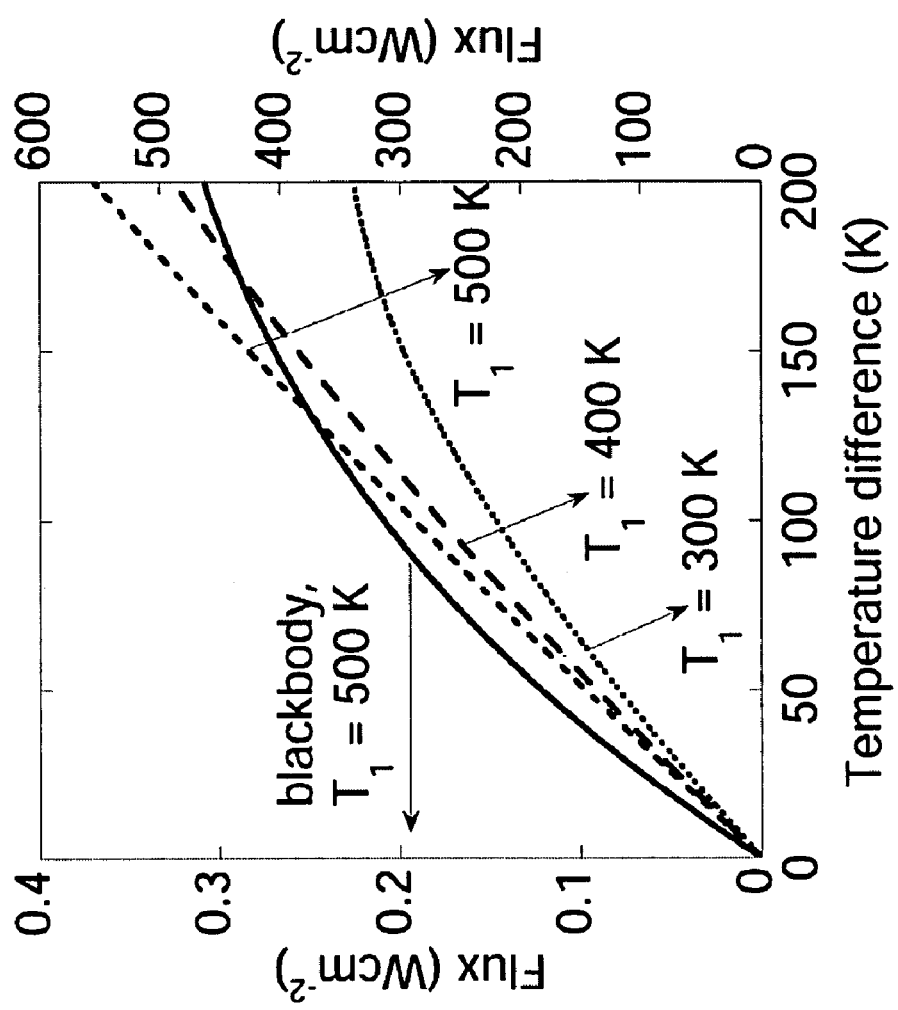
FIG. 5 depicts calculated energy transfer between two half-spaces of InSb. The hotter half-space can be maintained at $T_1$ and the temperature of the colder half-space can be varied. The x-axis is the calculated temperature difference between the hot and cold bodies. The blackbody energy transfer, the hotter half-space maintained at 500 K, corresponds to the y-axis on the left. The other curves correspond to the y-axis on the right.

FIG. 5 shows the net energy transfer calculated from one half-space at a constant temperature as a function of temperature difference between the two half-spaces. For comparison, the net energy transfer between two blackbodies, one of them at 500 K, is also shown in FIG. 5. The resonance effect of surface-plasmon can result in an energy transfer around 3-4 orders of magnitude higher than the far-field value. The net surface-plasmon energy transfer can also be a function of the distance between hot and cold surface (as shown in FIG. 4). The smaller the vacuum gap d, the larger can be the energy transport flux for a given temperature difference. The total energy flux of surface wave tunneling can be proportional to $1/d^2$. In the following sections, a 10 nm vacuum gap is assumed for purposes of illustration.

Surface-Plasmon Coupled Nonequilibrium Thermoelectric Devices

Standard thermoelectric device models assume that electrons and phonons are under local equilibrium. However, depending on the electron-phonon energy exchange rate and the rate of heat input, the electrons can be heated (or cooled) to a much higher (or lower) temperature than the phonons. Such a nonequilibrium electron-phonon effect, which is often called hot electron effect in high field electronics since electrical fields heat up electrons first, has been extensively studied for high field electronics and laser-material interactions where the electrons can be thrown out of equilibrium from lattice due to excitation by ultra-short laser pulse (E. M. Conwell, *High Field Transport in Semiconductors* (Academic press, New York & London, 1967); R. R. Alfano, Ed., *Semiconductor Probed by Ultrafast Laser Spectroscopy* (Academic Press, New York, 1984); L. Challis, Ed., *Electron-Phonon Interactions in Low Dimensional Structure* (Oxford University Press, Oxford, 2003); R. W. Schoenlein, W. Z. Lin, J. G. Fujimoto, and G. L. Easley, Phys. Rev. Lett. 58, 1680 (1987); T. Q. Qiu, and C. L. Tien, Trans. ASME, J. Heat Transf. 115, 835 (1993). A few papers have also dealt with nonequilibrium electron and phonon transport in thermoelectric research (V. S. Zakordonests and G. N. Logvinov, Semiconductors 31, 265 (1997); Yu G. Gurevich and G. N. Logvinoz, Sov. Phys. Semicond. 26, 1091 (1992); Y. G. Gurevich, O. L. Mashkevich, Phys. Rep. (Rev. Sec. Phys. Lett.) 181, 327 (1989); L. P. Bulat and V. G. Yatsyuk, Sov. Phys.-Semicond. 18, 383 (1984); L. I. Anatychuk, L. P. Bulat, D. D. Nikirsa, and V. G. Yatsyuk, Sov. Phys.-Semicond. 21, 206 (1987); L. P. Bullat, Thermoelectricity under large temperature gradients, J. Themoelect. 4, 3 (1997); G. Chen and T. Zeng, Microscale Thermophyis. Eng. 5, 71 (2001)).

Such a nonequilbrium situation can be modeled with a two-temperature model, which assumes that electron and phonons can be in equilibrium with their respective subsystems and can have their own temperature, and that the boundary conditions can be separately formulated. For this treatment to be valid, the electron-electron collisions which randomize the electron energy can be frequent enough, a condition usually satisfied if the electron concentration can be $10^{16}$ cm$^{-3}$ or higher, as can be the case in many thermoelectric materials. For convenience of example, this analysis is further restricted to monopolar (single carrier) semiconductors and it is assumed that there is no electron-hole pair generated and thus no photo-electric current and no additional recombination heat need to be considered. For convenience of example, the temperature dependence of thermoelectric properties ($k_e$, $k_p$, σ and S) is also neglected, and thus no Thompson effect is included in the model. Under these approximations, the governing transport equations for electron and phonon subsystems in the thermoelectric element can be represented as:

$$k_e \frac{d^2 T_e}{dx^2} - G(T_e - T_p) + \frac{j^2}{\sigma} = 0 \tag{3}$$

$$k_p \frac{d^2 T_p}{dx^2} + G(T_e - T_p) = 0 \tag{4}$$

where $T_e$ and $T_p$ represent electron and phonon temperatures respectively, j represents the current density passing through the thermoelectric element, and G represents the volumetric electron-phonon energy coupling constant, which can also be viewed as the cooling or heating rate of electrons due to their interaction with phonons. The first terms in Eqs. (3) and (4) represent heat conduction terms due to electron carriers and phonon carriers respectively, $G(T_e-T_p)$ describes the energy coupling or interaction between electron and phonon subsystems, and $j^2\rho$ represents the energy input to the electron subsystem due to Joule heating.

The general solutions for the electron and phonon temperatures are, $$T_e(x) - T_p(x) = \theta_0 + \theta(x) \tag{5}$$

$$T_p(x) = -\frac{k_e}{k_e + k_p}\theta(x) - \frac{j^2}{2\sigma(k_e + k_p)}x^2 + C_3 x + C_4 \text{ where} \tag{6}$$

$$\theta_o = \frac{j^2 k_p}{G\sigma(k_e + k_p)}, \theta(x) = C_1 e^{mx} + C_2 e^{-mx} \text{ and} \tag{7}$$

$$m^2 = \frac{G(k_e + k_p)}{k_e k_p} \tag{8}$$

The above general solutions have been obtained before together with different boundary conditions to determine coefficients $C_1$ to $C_4$. The concept of coupling through surface-plasmons can lead to establishment of new boundary conditions that can be difficult to realize in conventional device configurations. Although the calculated temperature profiles can seem different in the surface-plasmon thermoelectric refrigerators (FIG. 1G) and power generators (FIG. 1H), the boundary conditions for the control equations can actually be similar.

At x=L, away from the plasmon coupling surfaces, for convenience of example, the electrons and phonons are assumed to be in equilibrium with each other at $T_2$. That is, $$T_e = T_2 \text{ and } T_p = T_2 \tag{9}$$

At x=0, the phonon subsystem can be assumed to be isolated, i.e.

$$\frac{dT_p}{dx} = 0. \tag{10}$$

This assumption can be used in most of the calculation results disclosed herein except FIG. 11 (shown later), since the surface-plasmon energy transport calculation in FIG. 4 shows that less than 10% of total energy coupling between the surfaces can be through surface phonon polaritons and this percentage can be further reduced by appropriate doping to control the separation between frequencies of the surface-plasmon and surface phonon-polariton.

The boundary condition for electron subsystem at x=0 can be written as $$q = Sj T_e \Big|_{x=0} - k_e \frac{dT_e}{dx}\Big|_{x=0} \tag{11}$$

The first term on the right is the Peltier cooling term, which represents the heat absorbed from the hot surface of the power generator or cold surface of the refrigerator. The second term represents the heat conducted by electrons.

It is through q in Eq. (11) that the equations of nonequilibrium electron-phonon transport model in thermoelectric devices can be coupled to the surface-plasmon energy transport model across the vacuum. Because of this coupling, neither the heat flux nor the temperature at x=0 (the interface between the vacuum and the thermoelectric element) are known variables. For power generators, the heat source temperature $T_1$ at x=−d can usually be taken as the input for efficiency calculation, where d is the size of the vacuum gap. For refrigerators, either the cooling target temperature $T_1$ or cooling power density can be given for the performance calculation. Thus numerical iteration can be inherently needed for the calculation of temperature distribution. After the temperature inside the thermoelectric element is known, the performance of the whole device can be estimated.

To evaluate refrigerator performance, the temperature at the interface of the vacuum and thermoelectric element can be calculated for a given cooling load (cooling rate) at a cooling target temperature $T_1$. Then the energy expenditure $p_{in}$ for cooling can be written as $$p_{in} = Sj(T_2 - T_e|_{x=0}) + \frac{j^2 L}{\sigma} \tag{12}$$

The coefficient of performance (COP) $\phi$ can be represented as $$\phi = \frac{q}{p_{in}} \tag{13}$$

The minimum cooling target temperature can be reached when q is set to zero.

For power generators, the power output depends on the external electrical load resistance $R_L$. Often the external resistance can be written as $$R_L = \mu R_{in} = \mu \frac{L}{\sigma A},$$

where $\mu$ represents the electrical resistance ratio, $R_{in}$ represents the electrical resistance of the thermoelectric element and A represents the cross-section area of the thermoelectric element. Then the electric current density in power generator can be written as $$j = \frac{V_2}{R_{TOT} A} = \frac{S(T_e|_{x=0} - T_2)}{\left(\frac{L}{\sigma A} + R_L\right) A} = \frac{S\sigma(T_e|_{x=0} - T_2)}{L(1+\mu)} \tag{14}$$

The power output $p_0$ can be, $$p_0 = \frac{j^2 R_L}{A} \tag{15}$$
$$= \frac{S^2 \sigma (T_e|_{x=0} - T_2)^2}{L} \frac{\mu}{(1+\mu)^2}$$
$$= \frac{Kz(T_e|_{x=0} - T_2)^2}{L} \frac{\mu}{(1+\mu)^2}$$

The energy conversion efficiency $\eta$ can be calculated as $$\eta = \frac{p_0}{q} \tag{16}$$

Also, the coefficient of performance (COP), minimum temperature for refrigeration, and the efficiency for power generation that can be obtained will be compared with that of standard devices, for which the corresponding expressions are well documented. (A. F. Ioff, *Semiconductor Thermoelements and Thermoelectric Cooling* (Info-search, London, 1956); T. C. Harman and J. M. Honig, *Thermoelectric and Thermomagnetic Effects and Applications* (MacGraw-Hill, New York, 1967); H. J. Goldsmid, *Electronic Refrigeration* (Pion Ltd., London, 1986); D. M. Rowe, *CRC Handbook of Thermoelectrics* (CRC Press, Inc., 1995); G. S. Nolas, J. W. Sharp and H. J. Goldsmid, *Thermoelectrics: Basics Principles and New Materials Developments* (Springer-Verlag, Berlin, 2001)).

There are currently no simple equations for performance evaluation of surface-plasmon coupled nonequilbrium thermoelectric devices. The numerical simulations are carried out herein to obtain various calculated optimum values. Before presenting any numerical results, however, criteria are developed herein that can serve as guidelines for device design and materials selection.

From the above discussion, in the proposed devices, an additional temperature drop between the heating (cooling) source and the thermoelectric element can develop across the vacuum gap. An effective thermal resistance for the vacuum gap, $R_{vac}$ can be defined due to the surface-plasmon energy transport, where $$R_{vac} = \frac{T_1 - T_e|_{x=0}}{q}.$$

This resistance typically must be small such that most temperature drop happens in the thermoelectric element rather than the vacuum gap, i.e., $$R_{vac} \ll R_{TE} \quad (17)$$

where $R_{TE}$ is the total thermal resistance of the thermoelectric element, which will be determined next.

For conventional thermoelectric devices (both power generator and refrigerator), the thermal resistance is given by $$\frac{L}{k}.$$

Figure 2B:
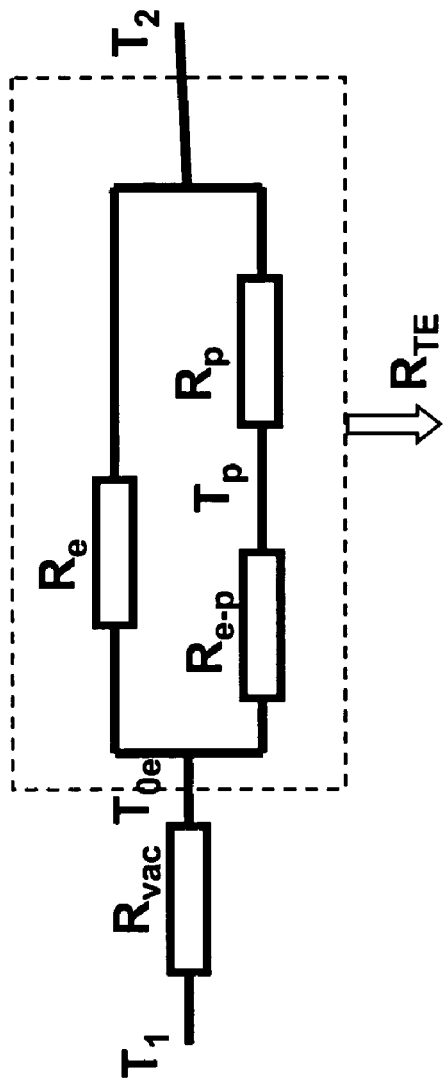
FIG. 2B depicts the thermal resistance network of surface-plasmon coupled nonequilibrium devices of the invention.

In the nonequilibrium thermoelectric devices, a first order analysis (neglecting the joule heating effect on thermal resistance model) gives the thermal resistance network as shown in FIG. 2B). When the energy can be coupled from the heat source or the cooling object to the interface between the vacuum and the thermoelectric element, it can be transported through two channels in the thermoelectric element. One is through the electron subsystem and the other is through the electron-phonon interaction and then the phonon subsystem. The electron-phonon coupling thermal resistance can be written as $$R_{e-p} = \frac{1}{GL_{e-p}} \quad (18)$$

where $L_{e-p}$ represents the length over which electron and phonon subsystems can have distinguishable temperatures. $L_{e-p}$ represents the thermoelectric element length or the electron cooling length, whichever is smaller. The electron cooling length l can be defined as the distance required for electrons and phonons to reach equilibrium from the boundary where electrons is heated or cooled, $$\frac{1}{l^2} = G\left[\frac{1}{k_e} + \frac{1}{k_p}\right] \quad (19)$$

The total thermal resistance of the thermoelectric element operating in nonequilibrium can be thus be approximated as, $$R_{TE} = \left(\frac{1}{R_e} + \frac{1}{R_{e-p} + R_p}\right)^{-1} = \left[\left(\frac{1}{GL_{e-p}} + \frac{L}{k_p}\right)^{-1} + \frac{k_e}{L}\right]^{-1} \quad (20)$$

If $$\frac{1}{GL_{e-p}}$$

is much less than $$\frac{L}{k_p},$$

the nonequilibrium effect is typically not noticeable and Eq. (20) can be simplified to that of a conventional thermoelectric device, $$\frac{L}{k}.$$

Thus, to have distinguishable benefit, $R_{TE}$ typically can be larger than the thermal resistance of a conventional device, that is $$R_{TE} > \frac{L}{k} \quad (21)$$

On the other hand, when $$\frac{1}{GL_{e-p}} + \frac{L}{k_p} \to \infty,$$

the thermoelectric element can be viewed as an almost perfect one with thermal conductivity of $k_e$ and corresponding $$Z = \frac{S^2\sigma}{k_e},$$

the enhancement in ZT due to the nonequilibrium is thus a factor of $$\frac{k}{k_e} = 1 + \frac{k_p}{k_e}.$$

Thus one can benefit from a nonequilibrium electron-phonon effect, if $$\frac{1}{GL_{e-p}} + \frac{L}{k_p} > \frac{L}{k_e}. \quad (22)$$

Normally $k_p$ can be larger than $k_e$ for thermoelectric materials, then the criterion can be written as $$\frac{1}{GL_{e-p}} > \frac{L}{k_e} \quad (23)$$

In nanostructured thermoelectric materials, $k_p$ can often be reduced to the same order of magnitude as $k_e$. In such a case, Eq. (22) can be used as a criterion.

In summary, surface-plasmon nonequilibrium devices can have superior performance compared to a conventional devices when:

1) $R_{vac} \ll R_{TE}$ to reduce the additional temperature drop due to surface-plasmon energy transfer. This criterion can also explain why the coupling by conventional far field radiation or the tunneling of regular evanescent waves is typically not sufficient for the proposed device configurations.

2) $\frac{1}{GL_{e-p}} > \frac{L}{k_e}$ to have distinguishable contribution from nonequilibrium electron-phonon temperatures.

Material Property Selection

The efficiency of conventional thermoelectric devices can be determined by ZT. Reviews of past and current research in thermoelectrics include C. Wood, Rep. Prog. Phys. 51, 459 (1988); A. F. Ioff, *Semiconductor Thermoelements and Thermoelectric Cooling* (Info-search, London, 1956); T. C. Harman and J. M. Honig, *Thermoelectric and Thermomagnetic Effects and Applications* (MacGraw-Hill, New York, 1967); H. J. Goldsmid, *Electronic Refrigeration* (Pion Ltd., London, 1986); D. M. Rowe, *CRC Handbook of Thermoelectrics* (CRC Press, Inc., 1995); G. S. Nolas, J. W. Sharp and H. J. Goldsmid, *Thermoelectrics: Basics Principles and New Materials Developments* (Springer-Verlag, Berlin, 2001); Tritt, T. M. Ed., Semiconductors and Semimetals 69-71 (2001).

Generally a good thermoelectric material can have S~200 μV/K, σ~$10^5$ $\Omega^{-1}$$m^{-1}$. For the disclosed devices, the electron-phonon coupling constant G can be of importance, as well as the plasmon frequency. The electron-phonon interaction is an active research area due to its important role in solid state physics, notably as the process that determine the electrical resistance, superconductivity, and the equilibrium dynamics of hot electrons. More often, the electron-phonon energy exchange is presented by electron energy relaxation time re in the literature (E. M. Conwell, *High Field Transport in Semiconductors* (Academic press, New York & London, 1967); L. Challis, Ed., *Electron-Phonon Interactions in Low Dimensional Structure* (Oxford University Press, Oxford, 2003); J. M. Ziman, *Electrons and Phonons* (Clarendon, Oxford, 1960); K. Seeger, *Semiconductor Physics*, $8^{th}$, (Springer, N.Y., 2002); B. K. Ridley, *Quantum Processes in Semiconductors* (Oxford University Press, Oxford, 1999); D. K. Ferry, *Semiconductor Transport* (Taylor & Francis, New York, 2000))

Neglecting the electron kinetic energy for the convenience of example, the electron-phonon coupling constant can be written as $$G = \frac{3nk_B}{2\tau_e} \quad (24)$$

G can be proportional to the doping concentration in Eq. (24) and can be a complicated function of both the electron and phonon temperatures rather than a constant, since $\tau_e$ can depend on both the electron scattering mechanism and the degeneracy. For discussion of the theoretical form of $\tau_e$ for various scattering mechanisms and for low dimensional systems, see (K. Seeger, *Semiconductor Physics*, $8^{th}$, (Springer, N.Y., 2002); B. K. Ridley, *Quantum Processes in Semiconductors* (Oxford University Press, Oxford, 1999); B. K. Ridley, Rep. Prog. Phys. 54, 169 (1991)). However, the theoretical value typically agrees only qualitatively with experimental results. A number of different techniques, including electrical transport (steady state) and optical methods (dynamics) have been used to study the electron energy relaxation (R. R. Alfano, Ed., *Semiconductor Probed by Ultrafast Laser Spectroscopy* (Academic Press, New York, 1984); L. Challis, Ed., *Electron-Phonon Interactions in Low Dimensional Structure* (Oxford University Press, Oxford, 2003); B. K. Ridley, Rep. Prog. Phys. 54, 169 (1991)).

Table I lists some experimental data of the energy relaxation time for various materials given in R. R. Alfano, Ed., *Semiconductor Probed by Ultrafast Laser Spectroscopy* (Academic Press, New York, 1984)). As can be seen, $\tau_e$ ranges from 0.1~10 ps at room temperature. At low temperatures, $\tau_e$ can be as long as tens of

TABLE I

Experimental data of the energy relaxation time (R. R. Alfano, Ed., Semiconductor Probed by Ultrafast Laser Spectroscopy (Academic Press, New York, 1984)).

| Material | Lattice Temperature (K) | Electron Temperature (K) | $\tau_e$ ($10^{-12}$ sec) |
|---|---|---|---|
| Si | 8 | 29 | 110.0 |
|  |  | 107 | 24.0 |
|  |  | 222 | 2.94 |
|  |  | 505 | 0.5 |
|  | 77 | 107 | 23.0 |
|  |  | 222 | 2.6 |
|  |  | 505 | 0.43 |
|  | 300 | 330 | 2.6 |
|  |  | 505 | 0.37 |
| Ge | 100 | 100 | 27.0 |
|  | 150 | 150 | 10.0 |
|  | 200 | 200 | 6.0 |
|  | 300 | 300 | 6.0 |
|  |  | 400 | 6.0 |
|  |  | 640 | 9.7 |
|  |  | 1500 | 19.0 |
| InSb | 4.2 | 5 | $2 \times 10^5$ |
|  |  | 10 | $3 \times 10^5$ |
|  |  | 15 | $4 \times 10^5$ |
|  | 1.15 | 1-15 | 2.35-3.3 $\times 10^5$ |
|  | 20 | 20 | $5 \times 10^5$ |
|  | 25 | 25 | $1.3 \times 10^5$ |
|  | 77 | 77 |  |

TABLE I-continued

Experimental data of the energy relaxation time (R.
R. Alfano, Ed., Semiconductor Probed by Ultrafast Laser
Spectroscopy (Academic Press, New York, 1984)).

| Material | Lattice Temperature (K) | Electron Temperature (K) | $\tau_g$ ($10^{-12}$ sec) |
|---|---|---|---|
|  |  | 122 | 1.76 |
|  |  | 192 | 2.46 |
|  |  | 297 | 3.37 |
| GaAs | 50 | 50 | 17.3 |
|  | 80 | 80 | 1.7 |
|  | 77 | 150 | 0.35 |
|  |  | 300 | 0.65 |
|  |  | 700 | 0.82 |
|  |  | 1000 | 1.02 |
|  | 300 | 350 | 1.42 |
|  |  | 500 | 1.28 |
|  |  | 800 | 1.94 |
|  |  | 1000 | 1.88 | nanoseconds. Depending on the doping concentration for ZT, G can range from $10^9$ to $10^{13}$ W/(m$^3$ K). The optimum doping concentration for thermoelectric material can vary from $10^{15}$ cm$^{-3}$ or $10^{16}$ cm$^{-3}$ for narrow bandgap materials (InSb, Hg$_{1-x}$Cd$_x$Te; see R. Bower, R. W. Ure, J. E. Bauerle, and A. J. Cornish, J. App. Phys. 30, 930 (1959); J. O. Sofo, G. D. Mahan, and J. Baars, J. Appl. Phys. 76, 2249 (1994)) to $10^{19}$ cm$^{-3}$ or $10^{20}$ cm$^{-3}$ for wide bandgap materials (SiGe). Most good thermoelectric semiconductors can have a G value around $10^{10}$ or $10^{12}$ W/(m$^3$ K) at their optimum ZT values. Metals can have very high G, which is around $10^{16}$~$10^{17}$ W/(m$^3$ K) (M. I. Kaganov, M. I. Lifshitz, and L. V. Tanatarov, Sov. Phys. JETP 4, 173 (1957); J. Fujimoto, J. M. Liu, E. P. Ippen, N. Bloembergen, Phys. Rev. Lett. 53, 1837 (1984); H. E. Elsayed-Al, T. B. Norris, M. A. Pessot, G. A. Mourou, Phys. Rev. Lett. 58, 1212 (1987); P. B. Allen, Phys. Rev. Lett. 59, 1460 (1987); R. H. M. Groeneveld, R. Sprik, A. Lagendijk, Phys. Rev. B 51, 11433 (1995).)

In the present calculation, S=200 µV K$^{-1}$, σ=$10^5$ Ω$^{-1}$m$^{-1}$ and k=2.0 Wm$^{-1}$K$^{-1}$. G and $k_e$/k can vary in different cases. With such material properties, the minimum temperature the cold end of a conventional thermoelectric refrigerator can achieve can be calculated as 241K at zero cooling load and a hot side temperature of 300K. When this material can be used to make a conventional thermoelectric power generator operating at 500K to 300K, the maximum efficiency can be calculated to be about 7%.

RESULTS AND DISCUSSION

Figure 6A:
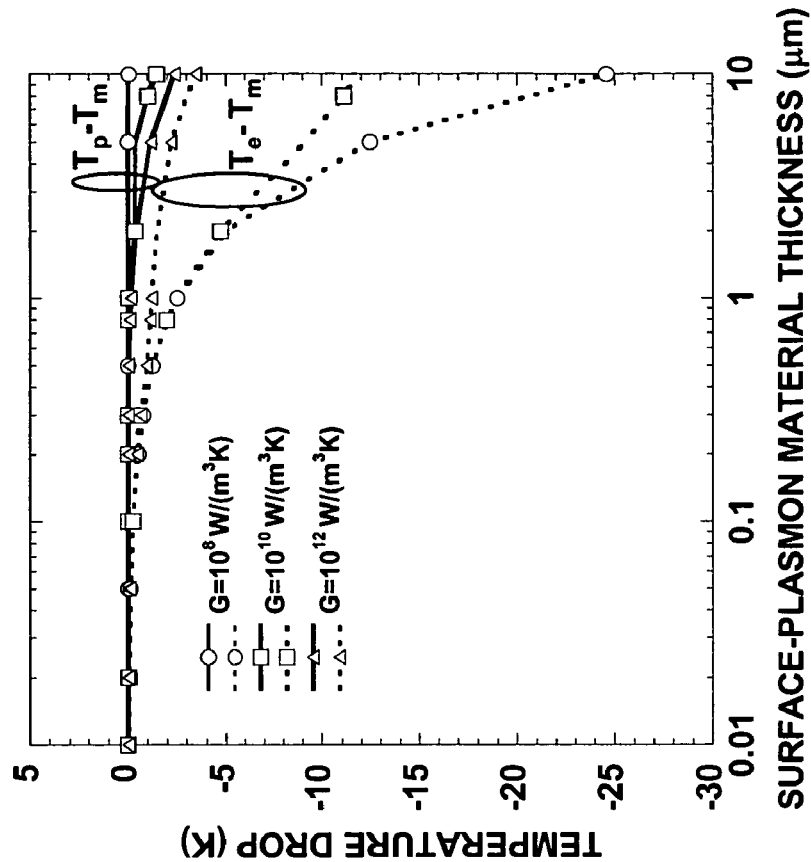
FIGS. 6A and 6B depicts temperature drop calculated for a surface-plasmon substrate with a thin metal layer underneath under a cooling heat flux of $q=50W/cm^2$.
Figure 6B:
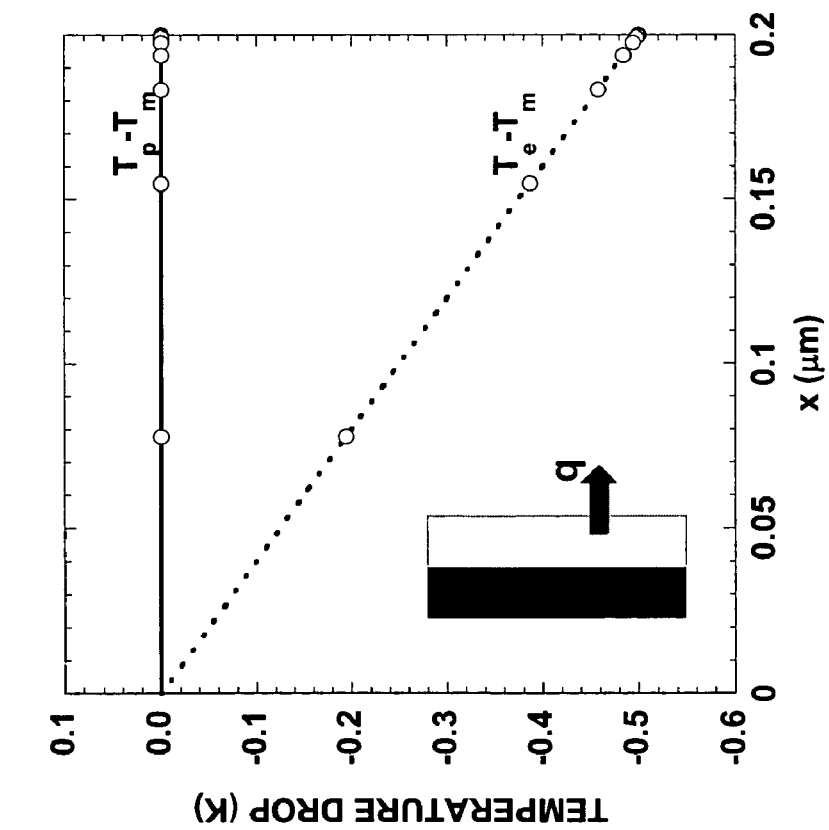

The model described above assume that the electrons and phonons can be in equilibrium with each other in the heat source or cooling target while maintaining their nonequilibrium state in the thermoelectric element. This assumption can be justified through careful design of the surface of the heat source or cooling target. The heat source or cooling target can be made of a very thin surface-plasmon material (such as InSb), coated on a metal layer. The high electron-phonon coupling constant of metal, which can usually be around 5 orders of magnitude larger than that of semiconductors, can ensure the equilibrium between electrons and phonons in the metal underneath the material layer that supports surface-plasmon. Then, the thickness of the surface-plasmon supporting material typically must satisfy two conditions: 1) The thickness can be large enough to support all the surface-plasmon energy flux. As calculated for FIG. 3, it can typically be at least about 10 nm. 2) The electron and phonon temperature drop inside the surface-plasmon material layer can typically be small. FIGS. 6A & 6B show the calculated temperature drop in the surface plasmon supporting layer under a cooling heat flux of q=50W/cm$^2$. FIG. 6A shows the calculated electron temperature drop ($T_e$-$T_m$) and phonon temperature drop ($T_p$-$T_m$) inside the surface-plasmon supporting material layer, where $T_m$ is the temperature at the surface of metal layer and surface-plasmon material. FIG. 6B shows the calculated temperature drop at the plasmon material surface as a function of the thickness of surface-plasmon material. Generally, the smaller the electron-phonon coupling constant, the larger the electron temperature drop. The temperature drop is less than 2.5 K if the thickness of the surface-plasmon material is less than 1 µm. It can be assumed for purpose of example that the electron temperature and phonon temperature can be in equilibrium and they are the same as the cooling target or heat source temperature if the cooling target or heat source are coated with tens or several hundred nanometers of surface-plasmon material with a thin metal layer underneath.

Refrigerator Example

Figure 7:
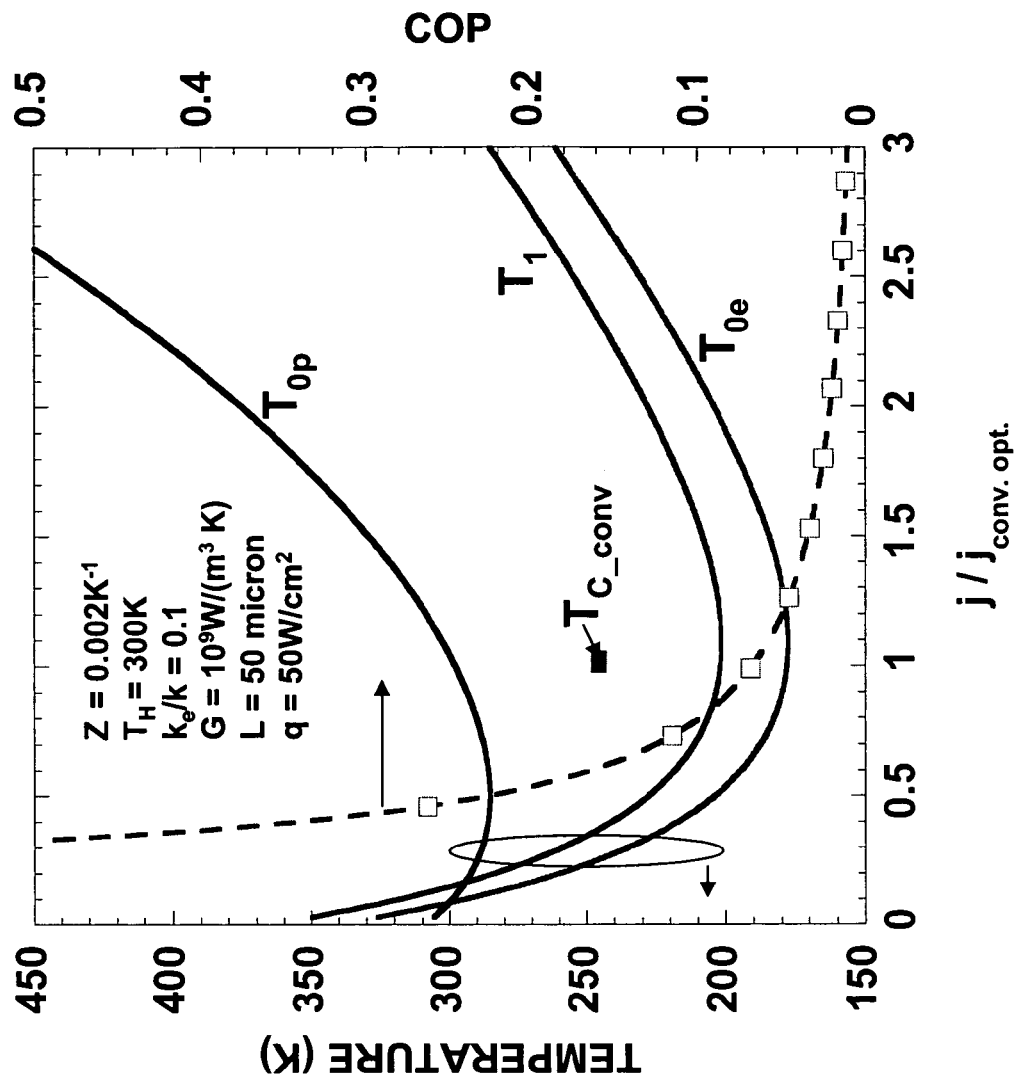
FIG. 7 depicts calculated typical temperature and coefficient of performance (COP) changes with the applied current under a cooling load. $T_{0e}$ and $T_{0p}$ are the electron and phonon temperatures calculated at the cold end of the thermoelectric element (i.e., the interface between the vacuum gap and the thermoelectric device) respectively, and $T_1$ is the calculated cooling target temperature. Comparing to the minimum temperature T=250 K that the conventional refrigerator can reach at such a cooling load at its optimum current density $j_{conv.opt}$, the surface-plasmon coupled nonequilibrium thermoelectric refrigerator can be expected to reach a much lower temperature.

FIG. 7 shows the calculated variation of several characteristic temperatures as a function of the current density under a cooling load of 50 W/cm$^2$. In FIG. 7, $T_{0e}$ and $T_{0p}$ are the electron and phonon temperatures at the cold end of the thermoelectric element (i.e., the interface between the vacuum gap and the thermoelectric element) respectively, and $T_1$ is the cooling target temperature. Two distinctive features of FIG. 7 are: 1) The phonon temperature $T_{0p}$ at the cold end is much higher than the electron temperature $T_{0e}$. The phonon temperature at the cold end can be even higher than the hot end temperature $T_2$ but the electrons at the cold end are still colder than $T_2$. This can be because the Peltier effect cools the electrons first. 2) By using surface-plasmon coupling, the cooling target can reach as low as the electron temperature at the cold end. However, due to the additional thermal resistance or temperature drop at the vacuum side, the cooling target temperature $T_1$ can typically be higher than $T_{0e}$ when there is an external cooling load. In FIG. 7 the cooling load can be first calculated from the maximum cooling power density of a conventional thermoelectric refrigerator operating at $T_2$=300K and $T_1$=250K, which is q=50W/cm$^2$ for L= 50 µm device. Then such a cooling load can be applied to the surface-plasmon coupled device to calculate the temperature distribution inside the device and the cooling target temperature by sweeping the applied current. As shown FIG. 7, compared to the calculated minimum temperature T=250 K that the conventional refrigerator can reach at such a cooling load at its optimum current $j_{conv.opt.}$, a surface-plasmon coupled nonequilibrium thermoelectric refrigerator can reach much lower temperatures. The minimum temperature with a cooling load of q=50W/cm$^2$ that a surface-plasmon coupled nonequilibrium thermoelectric refrigerator can achieve is $T_1$=201.63K, which corresponds to Z=0.00547 K$^{-1}$ or $ZT_H$=1.641 ($T_H$=300K). If the cooling target can be kept at $T_1$=250K, a much smaller current than the conventional optimum current $j_{conv.opt.}$ can be applied and thus a much higher COP (for example as large as 0.40) compared to the 0.092 of the conventional refrigerator can be achieved.

Figure 8A:
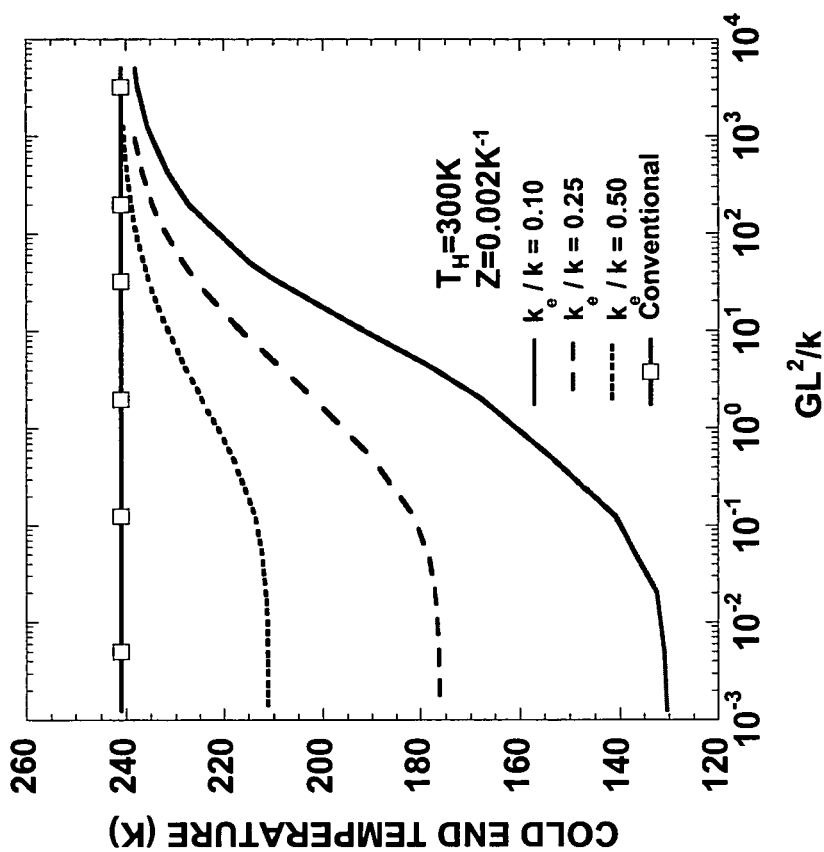
FIG. 8A depicts the minimum cooling temperature of the surface-plasmon coupled nonequilibrium thermoelectric refrigerator calculated as a function of thermoelectric element length for various G values. Typically, the shorter the thermoelectric element length and the smaller the coupling constant G, the lower the minimum temperature that can be achieved.

When the cooling load is removed, a thermoelectric refrigerator can achieve its minimum temperature if the corresponding current can be applied. In a surface-plasmon coupled nonequilibrium thermoelectric refrigerator, this means that the cooling target temperature (both electrons and phonons at the cooling target) can achieve the same temperature as the cold end electron temperature of the thermoelectric element. FIG. 8A shows the calculated minimum temperature of the surface-plasmon coupled nonequilibrium thermoelectric refrigerator as a function of thermoelectric element length for various G values. Shorter thermoelectric element lengths and smaller coupling constant G values can be associated with lower minimum temperatures that can be reached. Interestingly, for the same $k_e/k=0.1$, the minimum temperature can be grouped as function of dimensionless parameter $$\frac{GL^2}{k}.$$

Figure 8B:
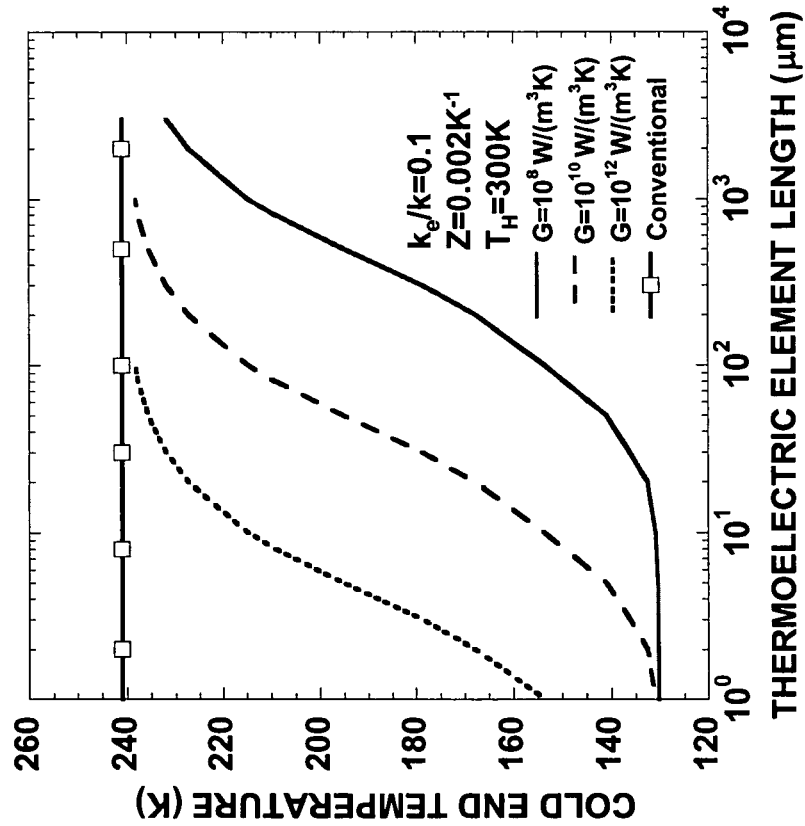
FIG. 8B depicts the minimum temperature calculated as a function of $$\frac{GL^2}{k}$$

FIG. 8B shows the calculated minimum temperature as a function of $$\frac{GL^2}{k}$$

for various $k_e/k$. For given values of Z and $$\frac{GL^2}{k},$$

typically the lower the $k_e/k$ ratio, the lower the minimum temperature, which means the phonon heat flux can be cut off more effectively.

FIG. 9 shows the calculated temperature distribution inside a 50 μm nonequilibrium thermoelectric refrigerator when the minimum cold end temperature can be reached. Typically, the smaller the electron phonon coupling constant G, the larger the temperature difference between electrons and phonons. For small G values ($10^8$ and $10^{10}$ W/(m$^3$ K)), the electron temperature near the hot end can be larger than the phonon temperature but electrons can be much colder than phonons at the cold side.

FIGS. 10A and 10B show the calculated performance of a surface-plasmon coupled nonequilibrium thermoelectric refrigerator under a cooling load of 50 W/cm$^2$, which can be the same as the maximum cooling power density of a L=50 μm conventional thermoelectric refrigerator with $Z=0.002K^{-1}$ operating at $T_H=300K$ and $T_C=250K$. FIG. 10A shows the calculated cooling target temperature change with thermoelectric element length and the electron-phonon coupling constant. Also shown in FIG. 10 is the calculated cooling target temperature for conventional thermoelectric refrigerators. Clearly, much lower cooling target temperature can be obtained for a wide range of G and L combinations than the conventional device with a same given load. For large G values, a smaller thermoelectric element length can be necessary to take advantage of the nonequilibrium effect. FIG. 10B compares the calculated COP of a surface-plasmon coupled nonequilibrium thermoelectric refrigerator with a conventional thermoelectric refrigerator with the cooling target temperature at 250 K. Compared to the maximum COP=0.092 for $Z=0.002K^{-1}$ material in a conventional thermoelectric refrigerator, which can be independent of the thermoelectric element length, the COP of surface-plasmon coupled nonequilibrium thermoelectric refrigerator can be a length dependent characteristic. For $G=10^{12}$ W/(m$^3$ K) (large G value), the benefit from the nonequilbrium electron-phonon effect can be much smaller than the degradation due to additional thermal resistance at the vacuum side. Thus, the COP can typically always be smaller than the conventional thermoelectric refrigerator. For low G values, the COP of surface-plasmon coupled nonequilibrium thermoelectric refrigerator can be much higher than the maximum of the conventional thermoelectric refrigerator.

As discussed above, there can be a small amount of energy flux due to the surface phonon polariton (the smaller peak in FIG. 4). The energy exchange through surface phonon polariton can degrade the performance calculated above since, in the case of refrigeration, the high phonon temperature in the thermoelectric element can cause a reverse flow of heat from the thermoelectric element to the cooling target. The degradation caused due to this surface phonon polariton energy exchange can be calculated by separating the energy exchange through surface-plasmons and surface phonon polaritons. The boundary conditions (10) and (11) can be changed accordingly. FIG. 11 shows the calculated cooling target temperature under a cooling load of 50 W/cm$^2$ with (dashed lines) and without (solid lines) consideration of the degradation. The degradation can be a few degrees for short thermoelectric elements. However, the overall performance can still be much better than a conventional thermoelectric refrigerator.

FIG. 15 shows a refrigeration device 100 that could be constructed. A first surface-plasmon substrate 112 opposes a second surface-plasmon substrate 120 that physically contacts a first face of thermoelectric substrate 114, defining phonon insulating gap 118. Surface plasmon substrates 112 and 120 are each made of highly doped InSb and are about 10 nanometers thick in the indicated direction. Thermoelectric substrate 114 is about 50 micrometers thick in the indicated direction and is made of doped InSb. A plurality of electrodes 116 electrically couple thermoelectric substrate 114 to power source 126. Phonon insulating gap 118 is a vacuum gap of about 10 nanometers in the indicated direction. Substrates 112 and 120 are also electrically isolated, i.e., they are electrically insulated from each other. Substrate 112 can be thermally coupled to a cooling target 122, and the back face of thermoelectric substrate 114 can be thermally coupled to a heat sink 124. Thus, by applying electrical power to thermoelectric substrate 114, thermal energy can be transferred from cooling target 122 to heat sink 124.

Power Generator Example

FIG. 12 shows the typical calculated change of the output power density and the energy conversion efficiency with the ratio of the external and internal thermal resistances $\mu=R_L/R_{TE}$ operating with heat source temperature at 500 K and the cold side temperature at 300 K. Compared to a conventional thermoelectric power generator, the surface-plasmon coupled device can have a much higher energy conversion efficiency over a wide range of $\mu=R_L/R_{TE}$. The optimum efficiency can be around 1.5 times the optimum of conventional thermoelectric power generator for given parameters. However the high efficiency can come with a decrease in the output energy density compared to the conventional thermoelectric power generator. The efficiency gain can be more of interest than the loss of energy density since the device power density typically can match the external thermal management capabilities.

FIG. 13A shows the calculated optimum efficiency as a function of thermoelectric element length for different electron-phonon coupling constant with $k_e/k=0.10$ and $Z=0.002K^{-1}$ operating at $T_1=500K$ and $T_2=300K$. For both G=$10^8$ W/(m³ K) and G=$10^9$ W/(m³ K), the efficiency of surface-plasmon coupled device can be higher than the conventional thermoelectric power generator due to the nonequilibrium electron-phonon effect. The longer the thermoelectric element, the less the benefit of the nonequilibrium effect and thus the less the energy conversion efficiency. For G=$10^{12}$ W/(m³ K), the effective thermal resistance in the thermoelectric element side can be small and so the performance can be limited by the surface-plasmon energy transport. With longer thermoelectric elements, the relative thermal resistance of the vacuum can decrease and thus the energy conversion efficiency increases.

FIG. 13B shows the calculated corresponding electron temperature at the hot end of the thermoelectric element. Typically, the longer the thermoelectric element, the higher is the electron temperature at the hot end which can be due to the relatively larger thermal resistance of the thermoelectric element.

FIG. 13C shows the calculated temperature distribution in a 50 μm surface-plasmon coupled nonequilibrium thermoelectric power generator when the heat source can be maintained at 500K. Again, it shows that the relative temperature drop at the vacuum side can be large for large G because the contribution of the nonequilibrium effect to the total thermal resistance of thermoelectric device can become small. It can also be seen that a small G can result in a large temperature difference at the hot end.

Similar to the refrigerator mode, the ratio of electron thermal conductivity contribution to the total thermal conductivity $k_e/k$ can also play an important role in the energy conversion efficiency. FIG. 14 shows the calculated energy conversion efficiency as a function of thermoelectric element length for different $k_e/k$. It is interesting to see that increasing $k_e/k$ can result in a change of the device from nonequilibrium effect dominated regime ($k_e/k$=0.10) to a vacuum thermal resistance regime ($k_e/k$=0.50) and can result in a conversion energy decrease.

Comparing the performance calculation of refrigerators and power generators, the nonequilbrium transport typically favors the realization of refrigerators over power generators due to: (1) at low temperatures, the electron-phonon coupling constant G can be several orders smaller; (2) at low temperatures, the thermal wavelength can be longer and thus the vacuum gap can be larger. Finally we note that the calculation results shown above are not optimized. Though ZT is a good indicator for the performance of conventional thermoelectric devices, it is only one of the determining factors of the performance of the surface-plasmon nonequilibrium thermoelectric devices. The optimum performance of such nonequilibrium devices can be determined by the plasma frequency $\omega_p$, and the damping $\gamma_e$, the electron-phonon coupling constant G, thermoelectric figure of merit ZT, and the contribution of the electrons to the total thermal conductivity, i.e., $k_e/k$. All these factors can be strong functions of doping concentration and temperature.

FIG. 16 shows a power generation device 200 that could be constructed. A first surface-plasmon substrate 212 opposes a second surface-plasmon substrate 220 that physically contacts a first face of thermoelectric substrate 214, defining phonon insulating gap 218. Surface plasmon substrates 212 and 220 are each made of highly doped InSb and are about 10 nanometers thick in the indicated direction. Thermoelectric substrate 214 is about 50 micrometers thick in the indicated direction and is made of doped InSb. A plurality of electrodes 216 electrically couple thermoelectric substrate 214 to load circuit 226. Phonon insulating gap 218 is a vacuum gap of about 10 nanometers in the indicated direction. Substrates 212 and 220 are also electrically isolated, i.e., they are electrically insulated from each other. Substrate 212 can be thermally coupled to a heat source 222, and the back face of thermoelectric substrate 114 can be thermally coupled to a heat sink 124.

Thus, heat can flow from heat source 222 through thermoelectric substrate 214 to heat sink 224, generating power in load circuit 226 coupled to thermoelectric substrate 214.

The entire teachings of each cited reference is incorporated herein by reference.

While this invention has been particularly shown and described with references to preferred embodiments thereof, it will be understood by those skilled in the art that various changes in form and details may be made therein without departing from the scope of the invention encompassed by the appended claims.

What is claimed is:

1. A surface-plasmon-coupled thermoelectric apparatus, comprising:
    a first surface-plasmon substrate; and
    a thermoelectric substrate electrically coupled to a plurality of electrodes, wherein the plurality of electrodes include an anode and a cathode, and
    wherein the substrates are electrically isolated from each other, and a first face of the thermoelectric substrate opposes a first face of the surface-plasmon substrate to define a phonon insulating gap.

2. The apparatus of claim 1, wherein the thickness of the phonon insulating gap is from about 1 nanometer to about 100 nanometers.

3. The apparatus of claim 2, further comprising a mechanism coupled to the substrates, whereby the thickness of the phonon insulating gap can be adjusted between about 1 nanometer to about 100 nanometers.

4. The apparatus of claim 2, wherein the phonon insulating gap is sealed at a pressure of less than about 0.01 Torr at 25° C.

5. The apparatus of claim 2, wherein the phonon insulating gap is sealed with an amount of inert gas such that at 25° C., less than about 1% of the heat transfer across the gap is due to the inert gas compared to that due to surface plasmon radiative energy flux.

6. The apparatus of claim 2, wherein the phonon insulating gap further includes an aerogel layer or a point contact array.

7. The apparatus of claim 2, wherein the thermoelectric substrate is a semiconductor.

8. The apparatus of claim 2, wherein the thermoelectric substrate is selected from the group consisting of InSb, HgCdTe, InAs, $Bi_2Te_3$, SiGe, PbTe, PbSe, HgSe, GaAs, InP, boron carbides, and boron silicides.

9. The apparatus of claim 8, wherein the thermoelectric substrate is selected from the group consisting of InSb, HgCdTe, and HgSe.

10. The apparatus of claim 7, further including a second surface-plasmon substrate coupled to the thermoelectric substrate, wherein the phonon insulating gap extends from the first face of the first surface-plasmon substrate to a first face of the second surface-plasmon substrate.

11. The apparatus of claim 10, wherein the first and second plasmon substrates include a semiconductor.

12. The apparatus of claim 11, wherein the second surface-plasmon substrate contacts the thermoelectric substrate.

13. The apparatus of claim 11, wherein the first and second plasmon substrates include a semiconductor independently selected from the group consisting of InSb, HgCdTe, InAs, $Bi_2Te_3$, SiGe, PbTe, PbSe, HgSe, GaAs, InP, boron carbides, and boron silicides.

14. The apparatus of claim 13, wherein the first and second plasmon substrates include a semiconductor independently selected from the group consisting of InSb, HgCdTe, and HgSe.

15. The apparatus of claim 13, wherein the first and second surface-plasmon substrates include the same semiconductor.

16. The apparatus of claim 12, wherein the second surface-plasmon substrate and the thermoelectric substrate are the same semiconductor, and the second plasmon substrate is a doped surface layer of the thermoelectric substrate.

17. The apparatus of claim 12, wherein the second surface-plasmon substrate and the thermoelectric substrate are different semiconductors.

18. The apparatus of claim 1, further including a first thermal reservoir thermally coupled to the first plasmon substrate and a second thermal reservoir thermally coupled to the thermoelectric substrate.

19. The apparatus of claim 1, further including a power supply electrically coupled to the electrodes, whereby the apparatus has a refrigeration mode.

20. The apparatus of claim 19, wherein the apparatus, in refrigeration mode, has a refrigeration efficiency greater than that of a comparison refrigeration device.

21. The apparatus of claim 1, further including a load circuit electrically coupled to the electrodes, whereby the apparatus has a power generation mode.

22. The apparatus of claim 21, wherein the apparatus, in power generation mode, has a power generation efficiency greater than that of a comparison power generation device.

23. The apparatus of claim 1, further including a metal layer coupled to a second face of the first surface-plasmon substrate.

24. A surface-plasmon-coupled refrigeration apparatus, comprising:
 a first surface-plasmon substrate;
 a thermoelectric substrate contacting a second surface-plasmon substrate; and
 a plurality of electrodes coupling the thermoelectric substrate to a power supply,
wherein the plurality of electrodes include an anode and a cathode, and wherein
 a first face of the first surface-plasmon substrate opposes a first face of the second surface-plasmon substrate to define a phonon insulating gap of between about 10 nanometers and about 100 nanometers thick;
 the surface-plasmon substrates are electrically isolated from each other; and each substrate is a semiconductor.

25. A surface-plasmon-coupled electrical current generator, comprising:
 a first surface-plasmon substrate;
 a thermoelectric substrate contacting a second surface-plasmon substrate; and
 a plurality of electrodes coupling the thermoelectric substrate to a load circuit,
wherein the plurality of electrodes include an anode and a cathode, and wherein
 a first face of the first surface-plasmon substrate opposes a first face of the second surface-plasmon substrate to define a phonon insulating gap of between about 10 nanometers and about 100 nanometers thick;
 the surface-plasmon substrates are electrically isolated from each other; and each substrate is a semiconductor.

* * * * *

UNITED STATES PATENT AND TRADEMARK OFFICE
CERTIFICATE OF CORRECTION

PATENT NO. : 7,508,110 B2  Page 1 of 1
APPLICATION NO. : 11/007557
DATED : March 24, 2009
INVENTOR(S) : Gang Chen, Ronggui Yang and Arvind Narayanaswamy It is certified that error appears in the above-identified patent and that said Letters Patent is hereby corrected as shown below:

<u>Claim 8, Column 26, Line 47</u>

Delete "claim 2" and insert --claim 7--.

Signed and Sealed this

Fourth Day of August, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,508,110 B2 | Page 1 of 1 |
| APPLICATION NO. | : 11/007557 | |
| DATED | : March 24, 2009 | |
| INVENTOR(S) | : Gang Chen, Ronggui Yang and Arvind Narayanaswamy | |

It is certified that error appears in the above-identified patent and that said Letters Patent is hereby corrected as shown below:

Column 1, lines 13-18, please delete "The invention was supported, in whole or in part, by a grant from the Office of Naval Research/Department of Defense/Multidisciplinary University Research Initiative (ONR/DOD/MURI) on electromagnetic Metamaterials Through UCLA, Grant No. N00014-01-1-0803. The Government has certain rights in the invention." and insert --This invention was made with government support under Grant No. N00014-03-1-0835, awarded by the U.S. Navy. The government has certain rights in this invention.--

Signed and Sealed this
Twenty-fourth Day of May, 2011

David J. Kappos
*Director of the United States Patent and Trademark Office*